(12) United States Patent
Osama et al.

(10) Patent No.: US 12,384,553 B2
(45) Date of Patent: Aug. 12, 2025

(54) BEARING CURRENT MITIGATION FOR AN ELECTRIC MACHINE EMBEDDED IN A GAS TURBINE ENGINE

(71) Applicants: General Electric Company, Schenectady, NY (US); General Electric Deutschland Holding GmbH, Frankfurt (DE); General Electric Company Polska Sp. z o.o., Warsaw (PL)

(72) Inventors: Mohamed Osama, Garching (DE); Bartlomiej Drozd, Otrebusy (PL); John Russell Yagielski, Scotia, NY (US)

(73) Assignees: General Electric Company, Evendale, OH (US); General Electric Deutschland Holding GmbH, Frankfurt (DE); General Electric Company Polska Sp. z o.o, Warsaw (PL)

( * ) Notice: Subject to any disclaimer, the term of this patent is extended or adjusted under 35 U.S.C. 154(b) by 233 days.

(21) Appl. No.: 18/338,390

(22) Filed: Jun. 21, 2023

(65) Prior Publication Data
US 2023/0344322 A1 Oct. 26, 2023

Related U.S. Application Data

(63) Continuation of application No. 17/205,028, filed on Mar. 18, 2021, now Pat. No. 11,735,982.

(51) Int. Cl.
*H02K 11/40* (2016.01)
*F02C 6/20* (2006.01)
(Continued)

(52) U.S. Cl.
CPC .............. *H02K 11/40* (2016.01); *F02C 6/206* (2013.01); *H02K 7/1823* (2013.01); *H02K 11/02* (2013.01);
(Continued)

(58) Field of Classification Search
CPC ...... H02K 11/40; H02K 7/1823; H02K 11/02; H02K 11/21; H02K 24/00; H03H 1/0007;
(Continued)

(56) References Cited

U.S. PATENT DOCUMENTS

| | | |
|---|---|---|
| 4,939,506 A | 7/1990 | Gram |
| 5,914,547 A | 6/1999 | Barahia et al. |

(Continued)

OTHER PUBLICATIONS

Aegis, Aegis Pro Series High Current Bearing Protection Ring, Medium Voltage Motors, Generators and Turbines, Electro Static Technology, 4 Pages. Retrieved from weblink https://www.est.aegis.com/PROseries/ on Jan. 29, 2021.

*Primary Examiner* — Charles Reid, Jr.
(74) *Attorney, Agent, or Firm* — Dority & Manning, P.A.

(57) ABSTRACT

A propulsor is provided including a gas turbine engine having a shaft and one or more bearings supporting the shaft, a rotor hub operatively coupled to the shaft and comprising a hub flange, an electric machine comprising a stator assembly and a rotor assembly, a rotor connection member operatively coupled to the rotor assembly of the electric machine and comprising a connection flange, and an insulated joint for operatively coupling the rotor assembly with the shaft. The insulated joint includes a plurality of insulative layers, at least one of the plurality of insulative layers extending between the hub flange and the connection flange to interrupt common mode electric current from flowing between the rotor assembly and the shaft.

20 Claims, 13 Drawing Sheets

(51) Int. Cl.
- *H02K 7/18* (2006.01)
- *H02K 11/02* (2016.01)
- *H02K 11/21* (2016.01)
- *H02K 24/00* (2006.01)
- *H03H 1/00* (2006.01)

(52) U.S. Cl.
CPC ............. *H02K 11/21* (2016.01); *H02K 24/00* (2013.01); *H03H 1/0007* (2013.01); *F05D 2220/323* (2013.01); *F05D 2220/76* (2013.01)

(58) Field of Classification Search
CPC ........... F05D 2220/323; F05D 2220/76; F05D 2260/31
USPC .......................................................... 290/52
See application file for complete search history.

(56) References Cited

U.S. PATENT DOCUMENTS

| | | |
|---|---|---|
| 6,447,252 B1 * | 9/2002 | Barker ............... F16D 1/06 416/210 A |
| 8,189,317 B2 | 5/2012 | Oh et al. |
| 8,229,682 B2 | 7/2012 | El-Refaie et al. |
| 9,097,134 B2 | 8/2015 | Ferch et al. |
| 11,236,678 B2 | 2/2022 | Davies |
| 2009/0162139 A1 | 6/2009 | Miller et al. |
| 2012/0171018 A1 | 7/2012 | Hasel et al. |
| 2016/0004810 A1 | 1/2016 | Solodovnik et al. |
| 2018/0083515 A1 | 3/2018 | Graves et al. |
| 2019/0044405 A1 | 2/2019 | Calebrese et al. |
| 2019/0081538 A1 | 3/2019 | Nye et al. |
| 2019/0186745 A1 | 6/2019 | Lowery et al. |
| 2020/0044518 A1 | 2/2020 | Miller et al. |
| 2020/0277994 A1 | 9/2020 | Brillon |
| 2020/0355122 A1 | 11/2020 | Foutch et al. |
| 2020/0385139 A1 | 12/2020 | Verna et al. |

\* cited by examiner

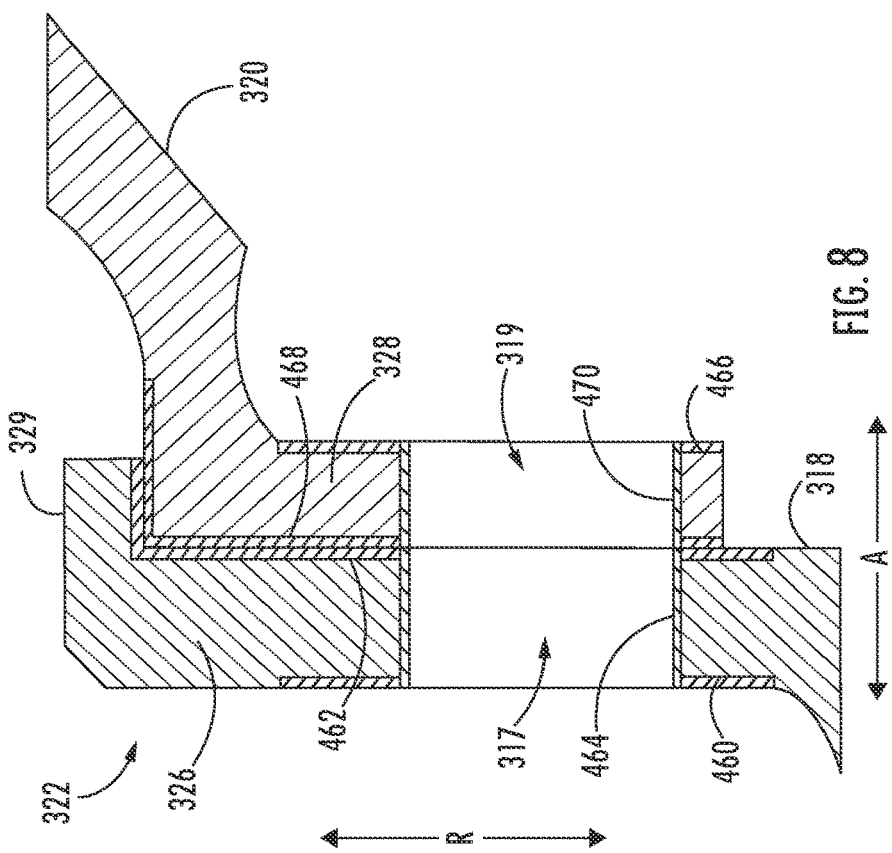
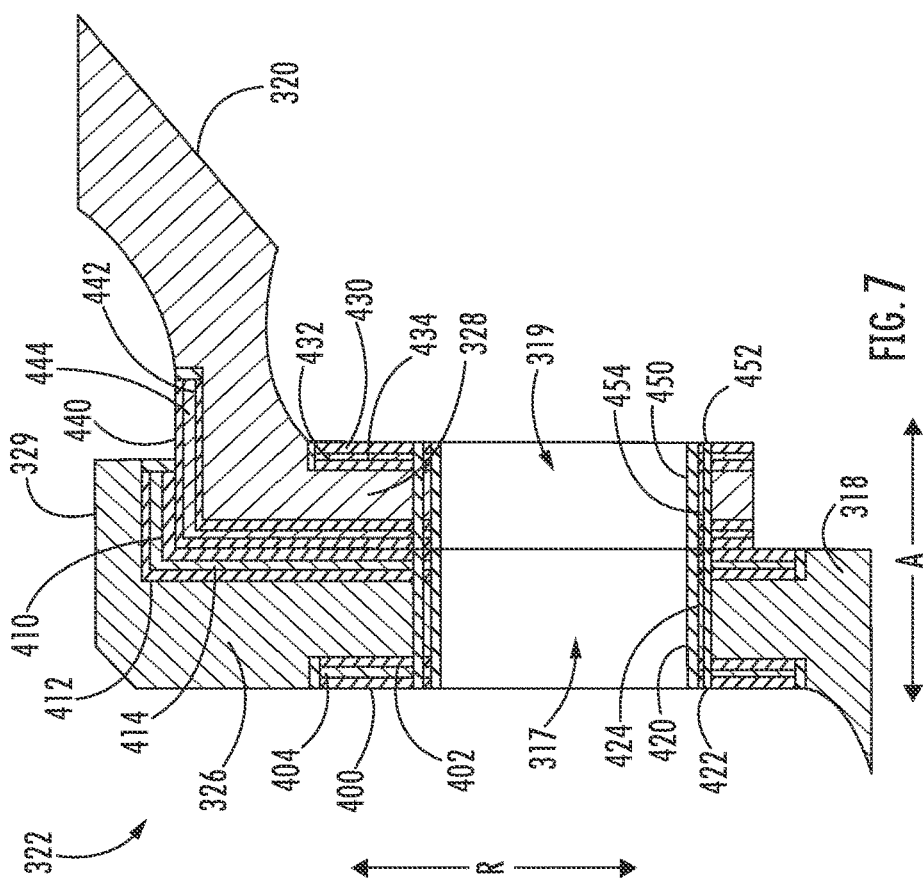

BEARING CURRENT MITIGATION FOR AN ELECTRIC MACHINE EMBEDDED IN A GAS TURBINE ENGINE

CROSS-REFERENCE TO RELATED APPLICATIONS

This application is a continuation of U.S. application Ser. No. 17/205,028, filed Mar. 18, 2021, titled "Bearing Current Mitigation for an Electric Machine Embedded in a Gas Turbine Engine," which is incorporated herein by reference in its entirety for all purposes.

FIELD

The present subject matter relates generally to gas turbine engines equipped with embedded electric machines.

BACKGROUND

A conventional commercial aircraft generally includes a fuselage, a pair of wings, and a propulsion system that provides thrust. The propulsion system typically includes at least two aircraft engines, such as turbofan jet engines. Each turbofan jet engine is typically mounted to a respective one of the wings of the aircraft, such as in a suspended position beneath the wing separated from the wing and fuselage.

Hybrid-electric propulsion systems are being developed to improve an efficiency of conventional commercial aircraft. Some hybrid electric propulsion systems include one or more electric machines each being operatively coupled with a rotating component of one of the aircraft engines. The inventors of the present disclosure have developed various configurations and/or methods to improve hybrid electric propulsion systems.

BRIEF DESCRIPTION

Aspects and advantages of the invention will be set forth in part in the following description, or may be obvious from the description, or may be learned through practice of the invention.

In one exemplary aspect of the present disclosure, a hybrid-electric propulsion system is provided. The hybrid-electric propulsion system includes a power converter and a propulsor. The propulsor includes a gas turbine engine having a shaft and one or more bearings supporting the shaft. Further, the propulsor includes an electric machine electrically coupled with the power converter. The electric machine includes a stator assembly and a rotor assembly. The rotor assembly has a rotor and a rotor connection assembly. The rotor connection assembly operatively couples the rotor with the shaft. The rotor connection assembly has an insulated joint for interrupting common mode electric current from flowing from the rotor to the shaft. A grounding device may be included to electrically ground the shaft.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 7 provides a close-up, cross-sectional view of an insulated joint of a rotor assembly of the electric machine according to one example embodiment of the present disclosure;

FIG. 8 provides a close-up, cross-sectional view of an insulated joint of a rotor assembly of the electric machine according to another example embodiment of the present disclosure;

DETAILED DESCRIPTION

Figure 1:
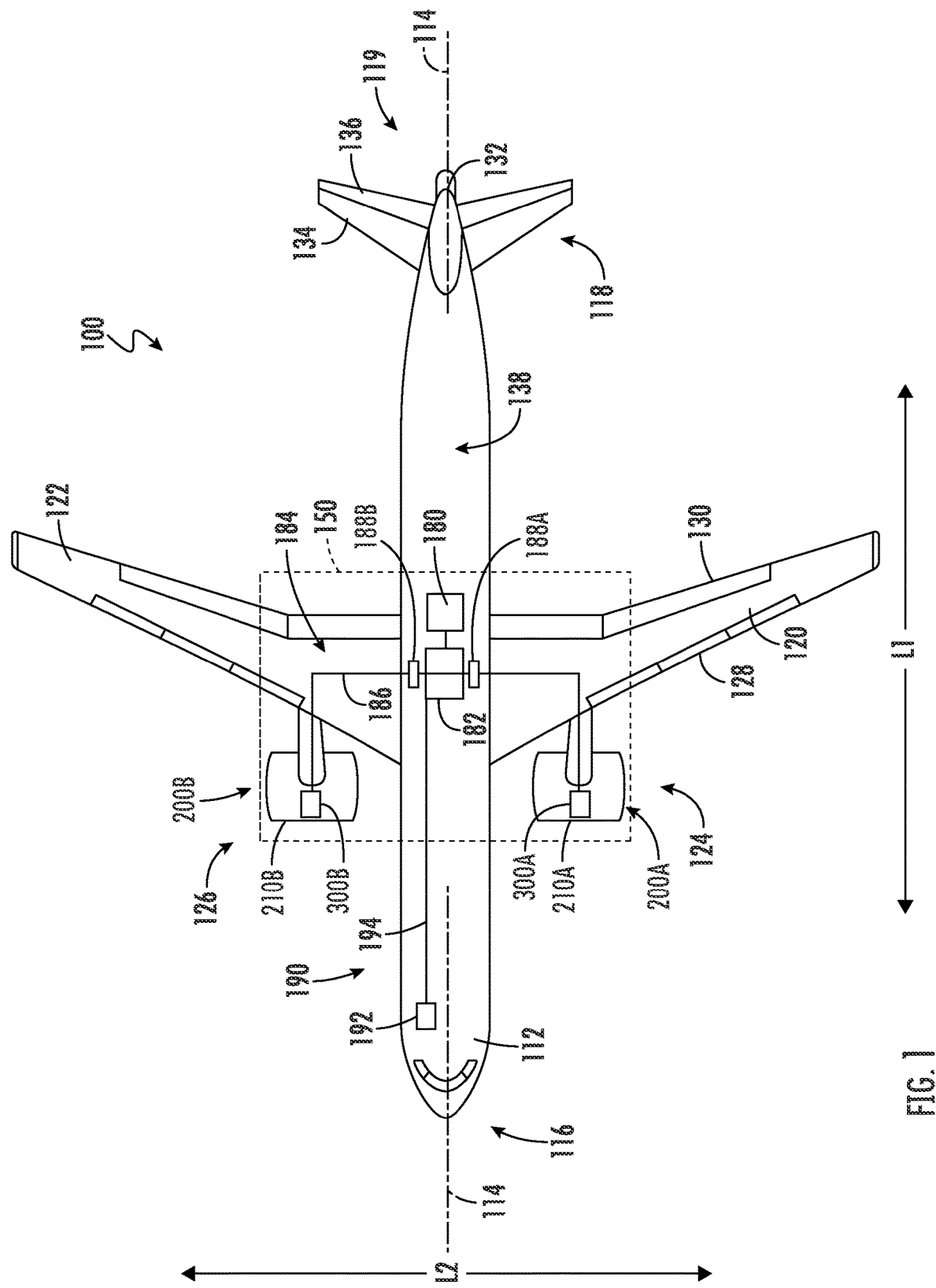
FIG. 1 provides a schematic top view of an aircraft according to various exemplary embodiments of the present disclosure.

Reference will now be made in detail to present embodiments of the invention, one or more examples of which are illustrated in the accompanying drawings. The detailed description uses numerical and letter designations to refer to features in the drawings. Like or similar designations in the drawings and description have been used to refer to like or similar parts of the invention.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all embodiments described herein should be considered exemplary.

As used herein, the terms "first", "second", and "third" may be used interchangeably to distinguish one component from another and are not intended to signify location or importance of the individual components.

The terms "forward" and "aft" refer to relative positions within a gas turbine engine or vehicle, and refer to the normal operational attitude of the gas turbine engine or vehicle. For example, with regard to a gas turbine engine, forward refers to a position closer to an engine inlet and aft refers to a position closer to an engine nozzle or exhaust.

The terms "upstream" and "downstream" refer to the relative direction with respect to a flow in a pathway. For example, with respect to a fluid flow, "upstream" refers to the direction from which the fluid flows, and "downstream" refers to the direction to which the fluid flows. However, the terms "upstream" and "downstream" as used herein may also refer to a flow of electricity.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. In at least some instances, the approximating language may correspond to the precision of an instrument for measuring the value, or the precision of the methods or machines for constructing or manufacturing the components and/or systems. For example, the approximating language may refer to being within a 1, 2, 4, 5, 10, 15, or 20 percent margin in either individual values, range(s) of values and/or endpoints defining range(s) of values.

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

The inventors of the present disclosure have developed various solutions for mitigating electric currents in bearings that support a shaft of a gas turbine engine to which an electric machine is coupled. As will be appreciated, common mode voltages can be produced by sinusoidal power supplies, such as power converter supplies. In this regard, an electric machine connected to a power converter supply is inherently subject to common mode voltages. Such common mode voltages can induce or drive electric currents in the bearings supporting the shaft to which the electric machine is coupled. Electric currents in bearings can cause pitting of bearing elements, such as the balls, rollers, races, etc., and consequently, premature failures of such bearings can occur. Accordingly, mitigation of such bearing electric currents is desirable.

Some conventional techniques for mitigating bearing currents in electric machines connected to power converters involve using ceramic bearings to support the shaft to which the electric machine is coupled. While such ceramic bearings are effective, in some instances, the use of ceramic bearings is not a viable option, e.g., when the bearings are shared with other components. Further, grounding brushes have been conventionally used in addition to ceramic bearings. However, like ceramic bearings, in some instances grounding brushes may not be allowed. The bearing electric current mitigation solutions developed by the inventors of the present disclosure provide alternative solutions to such conventional techniques.

In accordance with the inventive aspects of the present disclosure, various bearing mitigation solutions are provided. Such solutions can be used alone or in combination with one another. For instance, in one example aspect, a three-prong solution can be implemented. The three-prong solution can include 1) reducing the common mode voltage reaching the electric machine from the power converter connected thereto; 2) interrupting the common mode current conductive path between the rotor of the electric machine and the shaft to which it is coupled; and 3) grounding at least one of the members connecting the rotor of the electric machine and the shaft.

In one example aspect, under prong one, an electromagnetic interference filter of a power converter electrically coupled with the electric machine can reduce the common mode voltage reaching the electric machine. In addition, shielded cables or shielded bus bars electrically coupling the power converter and the electric machine can be used to further reduce the common mode voltage reaching the electric machine. Under prong two, a rotor connection assembly coupling the rotor of the electric machine with the shaft can include an insulated joint. The insulated joint includes one or more insulative members strategically arranged to interrupt common mode electric current from flowing to the shaft. Under prong three, a grounding device is positioned relative to the shaft or a component rotatable with the shaft to electrically ground the shaft. The grounding device can be integrated into an existing component of the engine. For instance, the grounding device can be integrated into a resolver, an encoder, or an existing seal, such as a carbon seal or a brush seal. Under this three-prong approach, bearing electric current mitigation can be achieved. Advantageously, this may enable achieving a specific fuel burn gain through the circulation of electric power between low speed and high speed spools without shortening the life of bearings supporting the spools. Moreover, this may enable mitigating the low speed bearing currents without modification of such bearings and with only minimal modification to the spool rotor structure.

FIG. 1 provides a schematic top view of an exemplary aircraft 100 as may incorporate one or more inventive aspects of the present disclosure. As shown in FIG. 1, for reference, the aircraft 100 defines a longitudinal direction L1 and a lateral direction L2. The lateral direction L2 is perpendicular to the longitudinal direction L1. The aircraft 100 also defines a longitudinal centerline 114 that extends therethrough along the longitudinal direction L1. The aircraft 100 extends between a forward end 116 and an aft end 118, e.g., along the longitudinal direction L1.

As depicted, the aircraft 100 includes a fuselage 112 that extends longitudinally from the forward end 116 of the aircraft 100 to the aft end 118 of the aircraft 100. The aircraft 100 also includes an empennage 119 at the aft end 118 of the aircraft 100. In addition, the aircraft 100 includes a wing assembly including a first, port side wing 120 and a second, starboard side wing 122. The first and second wings 120, 122 each extend laterally outward with respect to the longitudinal centerline 114. The first wing 120 and a portion of the fuselage 112 together define a first side 124 of the aircraft 100 and the second wing 122 and another portion of the fuselage 112 together define a second side 126 of the aircraft 100. For the embodiment depicted, the first side 124 of the aircraft 100 is configured as the port side of the aircraft 100 and the second side 126 of the aircraft 100 is configured as the starboard side of the aircraft 100.

The aircraft 100 includes various control surfaces. For this embodiment, each wing 120, 122 includes one or more leading edge flaps 128 and one or more trailing edge flaps 130. The aircraft 100 further includes, or more specifically, the empennage 119 of the aircraft 100 includes a vertical stabilizer 132 having a rudder flap (not shown) for yaw control and a pair of horizontal stabilizers 134 each having an elevator flap 136 for pitch control. The fuselage 112 additionally includes an outer surface or skin 138. It should be appreciated that in other exemplary embodiments of the present disclosure, the aircraft 100 may additionally or alternatively include any other suitable configuration. For example, in other embodiments, the aircraft 100 may include any other control surface configuration.

The exemplary aircraft 100 of FIG. 1 also includes a hybrid-electric propulsion system 150. For this embodiment, the hybrid-electric propulsion system 150 has a first propulsor 200A and a second propulsor 200B both operable to produce thrust. The first propulsor 200A is mounted to the first wing 120 and the second propulsor 200B is mounted to the second wing 122. Moreover, for the embodiment depicted, the first propulsor 200A and second propulsor 200B are each configured in an underwing-mounted configuration. However, in other example embodiments, one or both of the first and second propulsors 200A, 200B may be mounted at any other suitable location in other exemplary embodiments.

The first propulsor 200A includes a gas turbine engine 210A and one or more electric machines, such as electric machine 300A operatively coupled with the gas turbine engine 210A. The electric machine 300A can be an electric generator, an electric motor, or a combination generator/motor. For this example embodiment, the electric machine 300A is a combination generator/motor. In this manner, when operating as an electric generator, the electric machine 300A can generate electrical power when driven by the gas turbine engine 210A. When operating as an electric motor, the electric machine 300A can drive or motor the gas turbine engine 210A.

Likewise, the second propulsor 200B includes a gas turbine engine 210B and one or more electric machines, such as electric machine 300B operatively coupled with the gas turbine engine 210B. The electric machine 300B can be an electric generator, an electric motor, or a combination generator/motor. For this example embodiment, the electric machine 300B is a combination generator/motor. In this manner, when operating as an electric generator, the electric machine 300B can generate electrical power when driven by the gas turbine engine 210B. When operating as an electric motor, the electric machine 300B can drive or motor a spool of the gas turbine engine 210B. Electric machine 300B can be configured and can operate in a similar manner as electric machine 300A described herein.

The hybrid-electric propulsion system 150 further includes an electric energy storage unit 180 (only one shown in FIG. 1) electrically connectable to the electric machines 300A, 300B, and in some embodiments, other electrical loads. In some exemplary embodiments, the electric energy storage unit 180 may include one or more batteries. Additionally, or alternatively, the electric energy storage units 180 may include one or more supercapacitor arrays, one or more ultracapacitor arrays, or both. For the hybrid-electric propulsion system 150 described herein, the electric energy storage unit 180 is configured to store a relatively large amount of electrical power. For example, in certain exemplary embodiments, the electric energy storage unit 180 may be configured to store at least about fifty kilowatt hours of electrical power, such as at least about sixty-five kilowatt hours of electrical power, such as at least about seventy-five kilowatts hours of electrical power, and up to about one thousand kilowatt hours of electrical power.

The hybrid-electric propulsion system 150 also includes a power management system having a controller 182 and a power bus 184. The electric machines 300A, 300B, the electric energy storage unit 180, and the controller 182 are each electrically connectable to one another through one or more electric lines 186 of the power bus 184. For instance, the power bus 184 may include various switches or other power electronics movable to selectively electrically connect the various components of the hybrid-electric propulsion system 150. Particularly, as shown in FIG. 1, a first power converter 188A of the power bus 184 is electrically coupled or connectable with the electric machine 300A via one or more electric lines 186 and a second power converter 188B of the power bus 184 is electrically coupled or connectable with the electric machine 300B via one or more electric lines 186. The power bus 184 may include other power electronics, such as inverters, converters, rectifiers, etc., for conditioning or converting electrical power within the hybrid-electric propulsion system 150.

The controller 182 is configured to control the power electronics to distribute electrical power between the various components of the hybrid-electric propulsion system 150. For example, the controller 182 may control the power electronics of the power bus 184 to provide electrical power to, or draw electrical power from, the various components, such as the electric machines 300A, 300B, to operate the hybrid-electric propulsion system 150 between various operating modes and perform various functions. Such is depicted schematically as the electric lines 186 of the power bus 184 extend through the controller 182.

The controller 182 can form a part of a computing system 190 of the aircraft 100. The computing system 190 of the aircraft 100 can include one or more processors and one or more memory devices embodied in one or more computing devices. For instance, as depicted in FIG. 1, the computing system 190 includes controller 182 as well as other computing devices, such as computing device 192. The computing system 190 can include other computing devices as well, such as engine controllers (not shown). The computing devices of the computing system 190 can be communicatively coupled with one another via a communication network. For instance, computing device 192 is located in the cockpit of the aircraft 100 and is communicatively coupled with the controller 182 of the hybrid-electric propulsion system 150 via a communication link 194 of the communication network. The communication link 194 can include one or more wired or wireless communication links.

For this embodiment, the computing device 192 is configured to receive and process inputs, e.g., from a pilot or other crew members, and/or other information. In this manner, as one example, the one or more processors of the computing device 192 can receive an input indicating a command to change a thrust output of the first and/or second propulsors 200A, 200B and can cause, in response to the input, the controller 182 to control the electrical power drawn from or delivered to one or both of the electric machines 300A, 300B to ultimately change the thrust output of one or both of the propulsors 200A, 200B.

The controller 182 and other computing devices of the computing system 190 of the aircraft 100 may be configured in substantially the same manner as the exemplary computing devices of the computing system 700 described below with reference to FIG. 15 (and may be configured to perform one or more of the functions of the exemplary method (600) described below).

Figure 2:
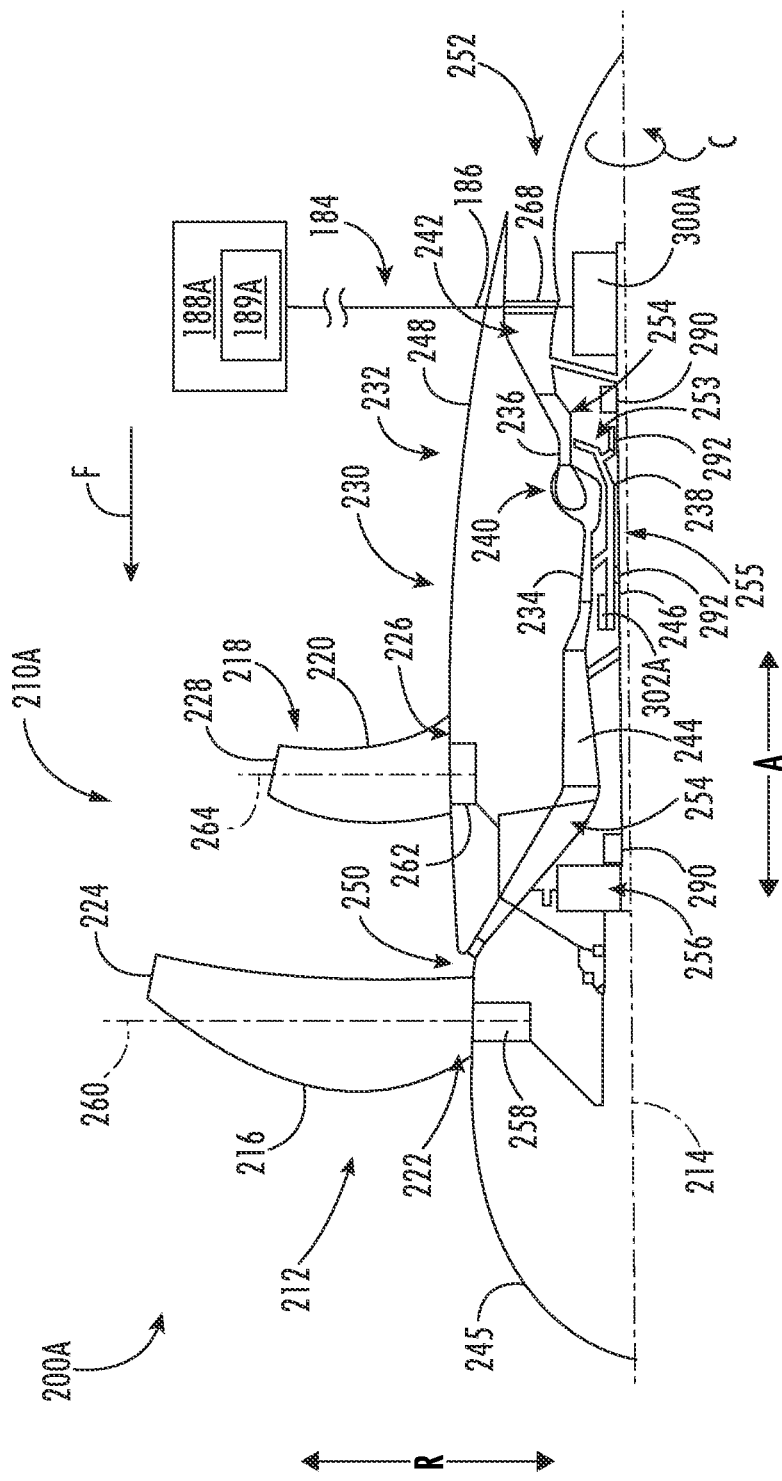
FIG. 2 provides a schematic cross-sectional view of one of the hybrid-electric propulsors of the aircraft of FIG. 1.

FIG. 2 provides a schematic view of the first propulsor 200A of the hybrid-electric propulsion system 150 of the aircraft 100 of FIG. 1. Although the first propulsor 200A is shown, it will be appreciated that the second propulsor 200B can be configured in the same or similar manner as the first propulsor 200A depicted in FIG. 2. The exemplary gas turbine engine of FIG. 2 is configured as a single unducted rotor engine 210A defining an axial direction A, a radial direction R, and a circumferential direction C. The engine 210A also defines a central longitudinal axis 214.

As shown in FIG. 2, the engine 210A takes the form of an open rotor propulsion system and has a rotor assembly 212 that includes an array of airfoils arranged around the central longitudinal axis 214 of engine 210A. More particularly, the rotor assembly 212 includes an array of rotor blades 216 arranged around the central longitudinal axis 214 of the engine 210A. Moreover, as will be explained in more detail below, the engine 210A also includes a non-rotating vane assembly 218 positioned aft of the rotor assembly 212 (i.e., non-rotating with respect to the central axis 214). The non-rotating vane assembly 218 includes an array of airfoils also disposed around central axis 214. More specifically, the vane assembly 218 includes an array of vanes 220 disposed around central longitudinal axis 214.

The rotor blades 216 are arranged in typically equally-spaced relation around the central longitudinal axis 214, and each blade has a root 222 and a tip 224 and a span defined therebetween. Similarly, the vanes 220 are also arranged in typically equally-spaced relation around the central longitudinal axis 214, and each has a root 226 and a tip 228 and a span defined therebetween. The rotor assembly 212 further includes a hub 245 located forward of the plurality of rotor blades 216.

Additionally, the engine 210A includes a turbomachine 230 having a core (or high pressure/high speed system) 232 and a low pressure/low speed system. It will be appreciated that as used herein, the terms "speed" and "pressure" are used with respect to the high pressure/high speed system and low pressure/low speed system interchangeably. Further, it will be appreciated that the terms "high" and "low" are used in this same context to distinguish the two systems, and are not meant to imply any absolute speed and/or pressure values.

The core 232 generally includes a high speed compressor 234, a high speed turbine 236, and a high speed shaft 238 extending therebetween and connecting the high speed compressor 234 and high speed turbine 236. The high speed compressor 234, the high speed turbine 236, and the high speed shaft 238 may collectively be referred to as a high speed spool 253 of the engine. Further, a combustion section 240 is located between the high speed compressor 234 and high speed turbine 236. The combustion section 240 may include one or more configurations for receiving a mixture of fuel and air, and providing a flow of combustion gasses through the high speed turbine 236 for driving the high speed spool 253.

The low speed system includes a low speed turbine 242, a low speed compressor 244 or booster, and a low speed shaft 246 extending between and connecting the low speed compressor 244 and low speed turbine 242. The low speed compressor 244, the low speed turbine 242, and the low speed shaft 246 may collectively be referred to as a low speed spool 255 of the engine.

Although the engine 210A is depicted with the low speed compressor 244 positioned forward of the high speed compressor 234, in certain embodiments the compressors 234, 244 may be in an interdigitated arrangement. Additionally, or alternatively, although the engine 210A is depicted with the high speed turbine 236 positioned forward of the low speed turbine 242, in certain embodiments the turbines 236, 242 may similarly be in an interdigitated arrangement.

In order to support the rotating components of the engine 210A, the engine 210A includes a plurality of bearings coupling the rotating components to various structural components. Specifically, as depicted in FIG. 2, bearings 290 support and facilitate rotation of the low speed shaft 246. Further, bearings 292 support and facilitate rotation of the high speed shaft 238. Although the bearings 290, 292 are illustrated as being located generally at forward and aft ends of their associated shafts 246, 238, the bearings 290, 292 may be located at any desired location along their associated shafts. Moreover, in some embodiments, one or more additional bearings other than the bearings 290 shown in FIG. 2 can be used to support the low speed shaft 246. For instance, in some embodiments, an additional bearing can be positioned at a central or mid-span region of the low speed shaft 246 provides support thereto. Similarly, one or more additional bearings other than the bearings 290 shown in FIG. 2 can be used to support the high-speed shaft 238. The bearings 290, 290 can be any suitable type of bearings, such as air bearings, oil-lubricated bearings, etc.

Referring still to FIG. 2, the turbomachine 230 is generally encased in a cowl 248. Moreover, it will be appreciated that the cowl 248 defines at least in part an inlet 250 and an exhaust 252, and includes a turbomachinery flowpath 254 extending between the inlet 250 and the exhaust 252. The inlet 250 is, for the embodiment shown, an annular or axisymmetric 360 degree inlet 250 located between the rotor assembly 212 and the fixed or stationary vane assembly 218 along the axial direction A, and provides a path for incoming atmospheric air to enter the turbomachinery flowpath 254 (and compressors 244, 234, combustion section 240, and turbines 236, 242) inwardly of the guide vanes 220 along the radial direction R. Such a location may be advantageous for a variety of reasons, including management of icing performance as well as protecting the inlet 250 from various objects and materials as may be encountered in operation. In other embodiments, however, the inlet 250 may be positioned at any other suitable location, e.g., aft of the vane assembly 218, arranged in a non-axisymmetric manner, etc.

As depicted, the rotor assembly 212 is driven by the turbomachine 230, and more specifically, the low speed spool 255 of the turbomachine 230. More specifically, for this embodiment, the engine 210A includes a power gearbox 256. The rotor assembly 212 is driven by the low speed spool 255 of the turbomachine 230 across the power gearbox 256. In such a manner, the rotating rotor blades 216 of the rotor assembly 212 may rotate around the central longitudinal axis 214 and generate thrust to propel engine 210A, and hence, the aircraft 100 (FIG. 1) to which it is associated, in a forward direction F. The power gearbox 256 can include a gearset for decreasing a rotational speed of the low speed spool 255 relative to the low speed turbine 242 such that the rotor assembly 212 may rotate at a slower rotational speed than the low speed spool 255.

As briefly noted above, the engine 210A includes vane assembly 218. The vane assembly 218 extends from the cowl 248 and is positioned aft of the rotor assembly 212. The vanes 220 of the vane assembly 218 may be mounted to a stationary frame or other mounting structure and do not rotate relative to the central longitudinal axis 214. For reference purposes, FIG. 2 depicts the forward direction with arrow F, which in turn defines the forward and aft portions of the engine 210A. As shown in FIG. 2, the rotor assembly 212 is located forward of the turbomachine 230 in a "puller" configuration and the exhaust 252 is located aft of the guide vanes 220. The vanes 220 of the vane assembly 218 are aerodynamically contoured to straighten out an airflow (e.g., reducing a swirl in the airflow) from the rotor assembly 212 to increase an efficiency of the engine 210A. For example, the vanes 220 may be sized, shaped, and configured to impart a counteracting swirl to the airflow from the rotor blades 216 so that in a downstream direction aft of both rows of airfoils (e.g., blades 216, vanes 220) the airflow has a greatly reduced degree of swirl, which may translate to an increased level of induced efficiency.

In some embodiments, it may be desirable that the rotor blades 216, the vanes 220, or both, incorporate a pitch change mechanism such that the airfoils (e.g., blades 216, vanes 220, etc.) can be rotated with respect to an axis of pitch rotation either independently or in conjunction with one another. Such pitch change can be utilized to vary thrust and/or swirl effects under various operating conditions, including to adjust a magnitude or direction of thrust produced at the rotor blades 216, or to provide a thrust reversing feature which may be useful in certain operating conditions, such as upon landing an aircraft, or to desirably adjust acoustic noise produced at least in part by the rotor blades 216, the vanes 220, or aerodynamic interactions from the rotor blades 216 relative to the vanes 220. More specifically, for the embodiment of FIG. 2, the rotor assembly 212 is depicted with a pitch change mechanism 258 for rotating the rotor blades 216 about their respective pitch axes 260, and the vane assembly 218 is depicted with a pitch change mechanism 262 for rotating the vanes 220 about their respective pitch axes 264.

The exemplary single rotor unducted engine 210A depicted in FIG. 2 is provided by way of example only. Accordingly, it will be appreciated that the engine 210A may have other suitable configurations. For example, in other example embodiments, the engine 210A can have other suitable numbers of shafts or spools, turbines, compressors, etc.; fixed-pitch blades or vanes 216, 220, or both; a direct-drive configuration (i.e., may not include the gearbox 256); etc. For example, in other exemplary embodiments, the engine 210A may be a three-spool engine, having an intermediate speed compressor and/or turbine. In such a configuration, it will be appreciated that the terms "high" and "low," as used herein with respect to the speed and/or pressure of a turbine, compressor, or spool are terms of convenience to differentiate between the components, but do not require any specific relative speeds and/or pressures, and are not exclusive of additional compressors, turbines, and/or spools or shafts.

Additionally or alternatively, in other exemplary embodiments, any other suitable gas turbine engine may be provided. For example, in other exemplary embodiments, the gas turbine engine may be a turboshaft engine, a turboprop engine, turbojet engine, etc. Moreover, for example, although the engine is depicted as a single unducted rotor engine, in other embodiments, the engine may include a multi-stage open rotor configuration, and aspects of the disclosure described hereinbelow may be incorporated therein.

Figure 3:
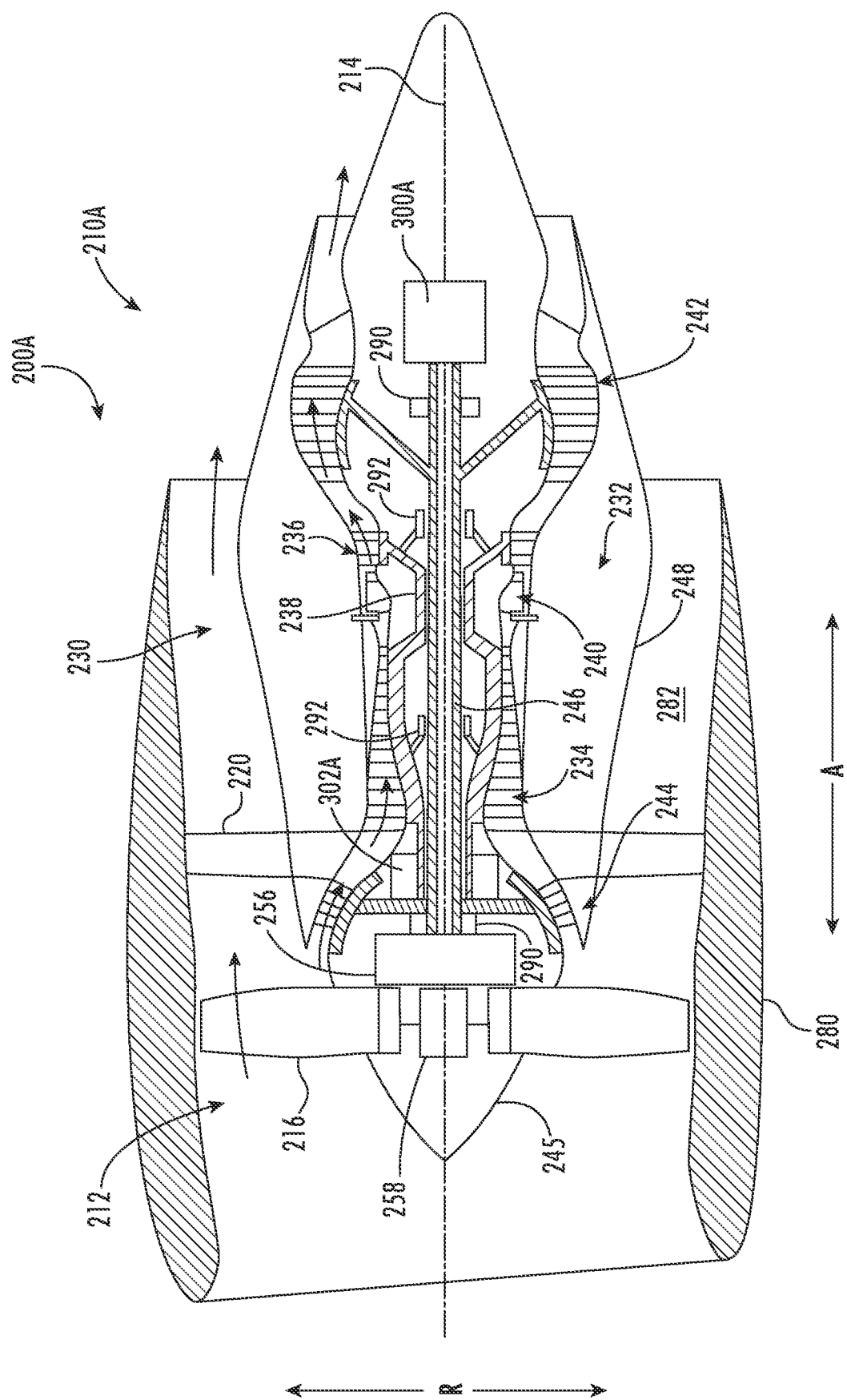
FIG. 3 provides a schematic cross-sectional view of a hybrid-electric propulsor that may be implemented with the aircraft of FIG. 1.

Further, in other exemplary embodiments, the engine 210A may be configured as a ducted turbofan engine. For example, referring briefly to FIG. 3, an engine 210A in accordance with another exemplary embodiment of the present disclosure is depicted. The exemplary embodiment of FIG. 3 may be configured in substantially the same manner as the exemplary engine 210A described above with respect to FIG. 2 except as noted below. The same or similar reference numerals may refer to the same or similar parts. As shown, the engine 210A of FIG. 3 includes a nacelle 280 circumferentially surrounding at least in part the rotor assembly 212 and turbomachine 230, defining a bypass passage 282 therebetween. The vanes 220 of the vane assembly 218 extend between and connect the nacelle 280 with the cowl 248.

Referring again to FIG. 2, as noted, the first propulsor 200A includes electric machine 300A operably coupled with a rotating component thereof. In this regard, the first propulsor 200A is an aeronautical hybrid-electric propulsion machine. Particularly, as shown in FIG. 2, the electric machine 300A is operatively coupled with the low speed spool 255 of the gas turbine engine 210A, and more particularly, the low speed shaft 246 of the low speed spool 255. As depicted, the electric machine 300A is embedded within the core of the gas turbine engine 210A. Specifically, the electric machine 300A is positioned inward of the turbomachinery flowpath 254 along the radial direction R. Moreover, for this embodiment, the electric machine 300A is positioned generally at the aft end of the gas turbine engine 210A and is at least partially overlapping with or aft of the low pressure turbine 242 along the axial direction A. However, in other exemplary embodiments, the electric machine 300A may be positioned at other suitable locations within the gas turbine engine 210A. For instance, in some embodiments, the electric machine 300A can be coupled with the low speed spool 255 in other suitable locations. For instance, in some embodiments, the electric machine 300A can be positioned forward of the low pressure compressor 244 along the axial direction A and inward of the turbomachinery flowpath 254 along the radial direction R. Further, as shown in FIG. 2, the electric machine 300A operatively coupled with the low speed shaft 246 is electrically coupled with the power bus 184 and is electrically connected to its associated power converter supply 188A.

In addition or alternatively to the gas turbine engine 210A having electric machine 300A coupled to the low speed spool 255, in some embodiments, the gas turbine engine 210A can include an electric machine 302A operatively coupled with the high speed spool 253 of the gas turbine engine 210A, and more particularly, the high speed shaft 238 of the high speed spool 253. As depicted in FIG. 2, the electric machine 302A is embedded within the core of the gas turbine engine 210A and is operatively coupled with the high speed shaft 238. The electric machine 302A is positioned inward of the turbomachinery flowpath 254 along the radial direction R and is positioned forward of the combustion section 240 along the axial direction A. However, in other exemplary embodiments, the electric machine 302A may be positioned at other suitable locations within the gas turbine engine 210A. Although not shown, the electric machine 302A operatively coupled with the high speed shaft 238 can be electrically coupled with the power bus 184 and can be electrically connected to its own power converter supply.

Like the electric machine 300A mechanically coupled with the low speed spool 255, the electric machine 302A mechanically coupled with the high speed spool 253 can be an electric motor operable to drive or motor the high speed shaft 238, e.g., during an engine burst. In other embodiments, the electric machine 302A can be an electric generator operable to convert mechanical energy into electrical energy. In this way, electrical power generated by the electric machine 302A can be directed to various engine and/or aircraft systems. In some embodiments, the electric machine 302A can be a motor/generator with dual functionality.

Figure 4:
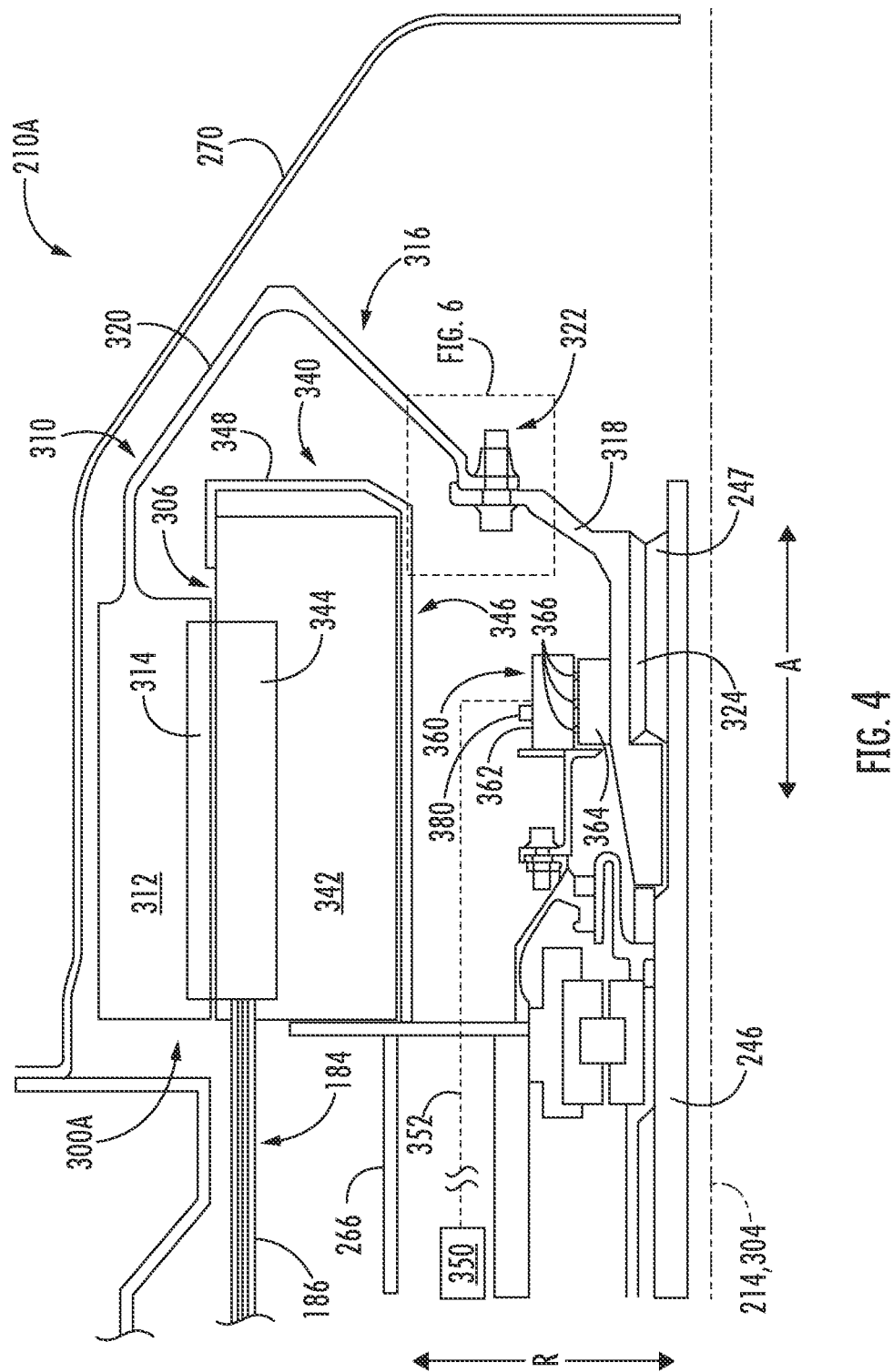
FIG. 4 provides a schematic cross-sectional view of an electric machine embedded in a gas turbine engine of the hybrid-electric propulsor of FIG. 2.

FIG. 4 provides a close-up, schematic view of the electric machine 300A embedded within the gas turbine engine 210A. As depicted, the electric machine 300A defines a centerline 304, which is aligned with or coaxial with the central longitudinal axis 214 of the gas turbine engine 210A in this example embodiment. The electric machine 300A includes a rotor assembly 310 and a stator assembly 340. The rotor assembly 310 includes a rotor 312 and the stator assembly 340 includes a stator 342. The rotor 312 of the rotor assembly 310 and the stator 342 of the stator assembly 340 together define an air gap 306 therebetween. Moreover, for this embodiment, the rotor 312 includes a plurality of magnets 314, such as a plurality of permanent magnets, and the stator 342 includes a plurality of windings or coils 344. As such, the electric machine 300A may be referred to as a permanent magnet electric machine. However, in other exemplary embodiments, the electric machine 300A may be configured in any suitable manner. For example, the electric machine 300A may be configured as an electromagnetic electric machine, including a plurality of electromagnets and active circuitry, as an induction type electric machine, a switched reluctance type electric machine, a synchronous AC electric machine, an asynchronous electric machine, or as any other suitable type of electric machine.

The rotor assembly 310 also includes a rotor connection assembly 316. Generally, the rotor connection assembly 316 operatively couples the rotor 312 with the low speed shaft 246. As the rotor assembly 310 of the electric machine 300A is coupled with or attached to the low speed shaft 246, the rotor assembly 310 is rotatable with the low speed shaft 246. As shown, the rotor connection assembly 316 has a rotor hub 318 and a rotor connection member 320. The rotor hub 318 is connected to the low speed shaft 246 and the rotor connection member 320 is connected to the rotor 312. The rotor hub 318 and the rotor connection member 320 are mechanically coupled or connected with one another by an insulated joint 322. Notably, the insulated joint 322 of the rotor connection assembly 316 interrupts common mode electric current from flowing between the rotor 312 and the low speed shaft 246, e.g., from the rotor 312 to the low speed shaft 246. In this way, common mode electric current is prevented from flowing to one or more bearings supporting the low speed shaft 246, among other components. The insulated joint 322 will be further described below with reference to FIG. 6.

For this embodiment, the rotor hub 318 of the rotor connection assembly 316 is connected to the low speed shaft 246 through a splined connection. More particularly, the rotor hub 318 includes a connection portion having a plurality of teeth 324. Similarly, the low speed shaft 246 includes a connection portion having a plurality of teeth 247. The plurality of teeth 324 of the rotor hub 318 are configured to engage with the plurality of teeth 247 of the low speed shaft 246, fixing the two components to one another. In alternative embodiments, the rotor hub 318 may be coupled to the low speed shaft 246 in any other suitable manner.

The stator assembly 340 also includes a stator connection assembly 346. The stator connection assembly 346 includes a stator connection member 348 that supports the stator 342. The stator connection member 348 is connected to a structural support member 266 of the turbine section of the gas turbine engine 210A. The structural support member 266 can be configured as part of an aft frame assembly of the gas turbine engine 210A. The aft frame assembly can include an aft strut 268 (FIG. 2) extending through the turbomachinery flowpath 254 along the radial direction R. The aft frame strut 268 provides structural support for the aft end of the cowl 248.

The gas turbine engine 210A further includes a cavity wall 270 surrounding at least a portion of the electric machine 300A. More specifically, the cavity wall 270 substantially completely surrounds the electric machine 300A, extending from a location proximate a forward end of the electric machine 300A to a location aft of the electric machine 300A along the axial direction A. The cavity wall 270 may function as, e.g., a cooling air cavity wall, a sump for cooling fluid, a protective cover for the electric machine 300A, etc. In some embodiments, the gas turbine engine 210A may further include a second cavity wall (not shown) to form a buffer cavity surrounding the electric machine 300A. The buffer cavity formed by the second cavity wall may thermally protect the electric machine 300A.

During certain operations of the gas turbine engine 210A, the low speed shaft 246 rotates the rotor assembly 310 of the electric machine 300A, allowing the electric machine 300A to generate electrical power. Thus, the electric machine 300A is operable in a generator mode. In some embodiments, in addition or alternatively to being operable in a generator mode, the electric machine 300A is operable in a drive mode during certain operations of the gas turbine engine 210A. In a drive mode, the rotor assembly 310 of the electric machine 300A drives the low speed shaft 246. The power converter 188A (FIG. 2) can be controlled to provide electrical power to the electric machine 300A via the electric lines 186, e.g., when the electric machine 300A is operating in a drive mode, and electrical power generated by the electric machine 300A can be carried or transmitted to the power converter 188A (FIG. 2) and ultimately to various electrical loads via the electric lines 186, e.g., when the electric machine 300A is operating in a generator mode. As shown best in FIG. 2, the electric lines 186 of the power bus 184 may extend through the turbomachinery flowpath 254 (e.g., through the aft frame strut 268) and electrically connect the electric machine 300A to the power converter 188A and ultimately to one or more electrical loads (accessory systems, electric/hybrid-electric propulsion devices, etc.), electrical sources (other electric machines, electric energy storage units, etc.), or both.

Figure 5:
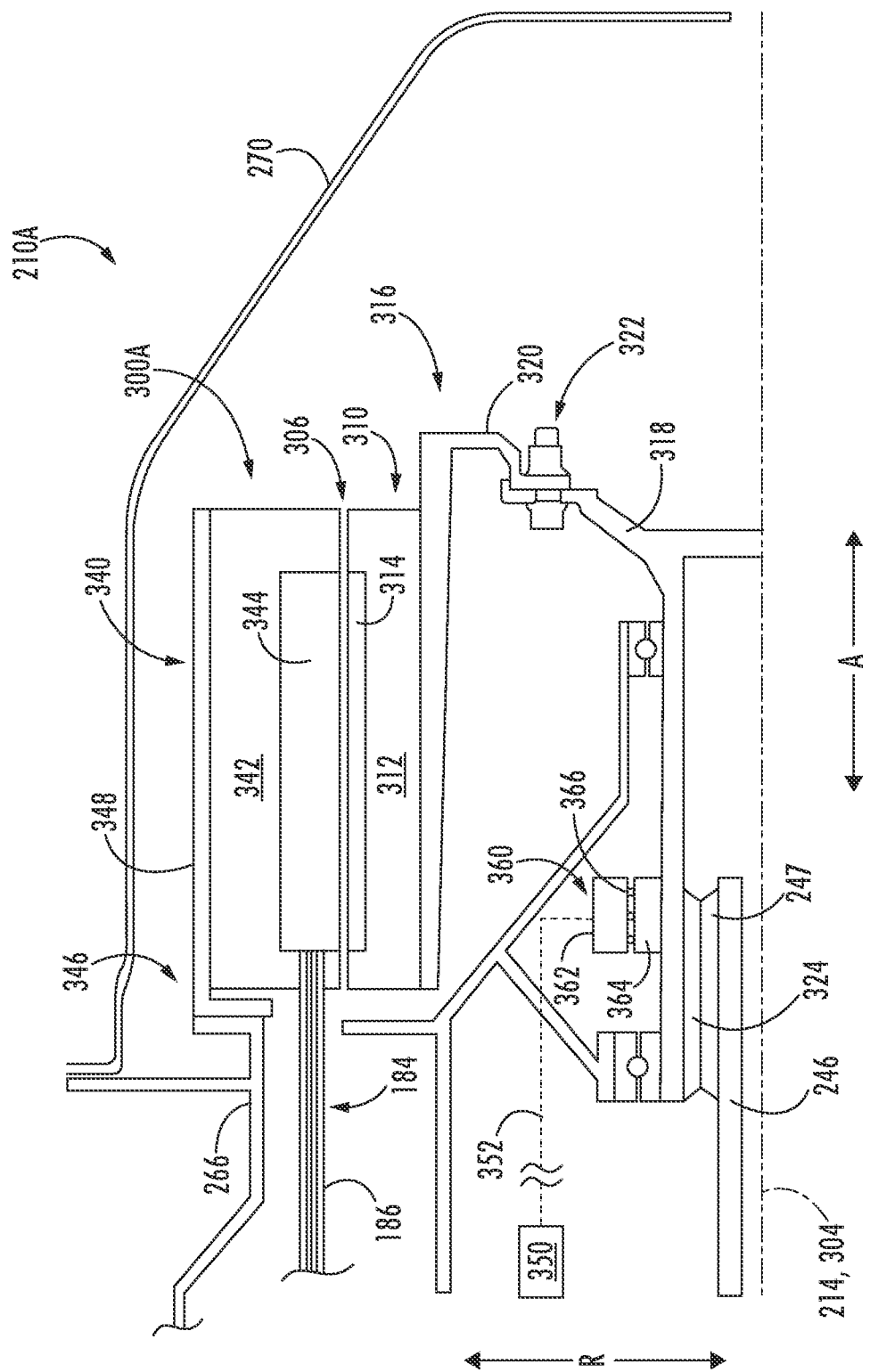
FIG. 5 provides a schematic cross-sectional view of an electric machine having an inner-rotor configuration and being embedded in a gas turbine engine according to various exemplary embodiments of the present disclosure.

Although the electric machine 300A has been described and illustrated in FIG. 4 as having a particular configuration, it will be appreciated that the inventive aspects of the present disclosure may apply to electric machines having alternative configurations. For instance, the stator assembly 340 and/or rotor assembly 310 may have different configurations or may be arranged in a different manner than illustrated in FIG. 4. As one example, the electric machine 300A may have an inner-rotor configuration as shown in FIG. 5 rather than the outer-rotor configuration shown in FIG. 4. In an inner-rotor configuration, as depicted in FIG. 5, the rotor 312 is positioned inward of the stator 342 along the radial direction R. In an outer-rotor configuration, as shown in FIG. 4, the rotor 312 is positioned outward of the stator 342 along the radial direction R. As another example, in some embodiments, the electric machine 300A may have a tapered configuration in which the rotor 312 and the stator 342 may extend lengthwise along the axial direction A at an angle with respect to the central longitudinal axis 214, e.g., so that they are not oriented parallel with the central longitudinal axis 214.

As noted previously, the inventors of the present disclosure have developed various solutions for mitigating electric currents in bearings that support a shaft of a gas turbine engine to which an electric machine is coupled. Such solutions can be used alone or in combination with one another. For instance, in one example aspect, a three-prong solution can be implemented. The three-prong solution can include 1) reducing the common mode voltage reaching the electric machine from the power converter connected thereto; 2) interrupting the common mode current conductive path between the rotor of the electric machine and the shaft to which it is coupled; and 3) grounding at least one of the members connecting the rotor of the electric machine and the shaft.

By way of example and with reference to FIGS. 2 and 4, under the first prong, the common mode voltage reaching the electric machine 300A from its associated power converter 188A can be reduced via an electromagnetic interference filter, or EMI filter. For this embodiment, for example, the power converter 188A has an electromagnetic interference filter 189A operable to reduce a common mode voltage reaching the electric machine 300A from the power converter 188A. Moreover, in addition, the power converter 188A can be electrically coupled with the electric machine 300A by one or more shielded cables. Particularly, as shown best in FIG. 4, the electric line 186 coupling the electric machine 300A with the power converter 188A can include one or more shielded cables. In addition or alternatively to shielded cables, the power converter 188A can be electrically coupled with the electric machine 300A by one or more shielded bus bars.

Figure 6:
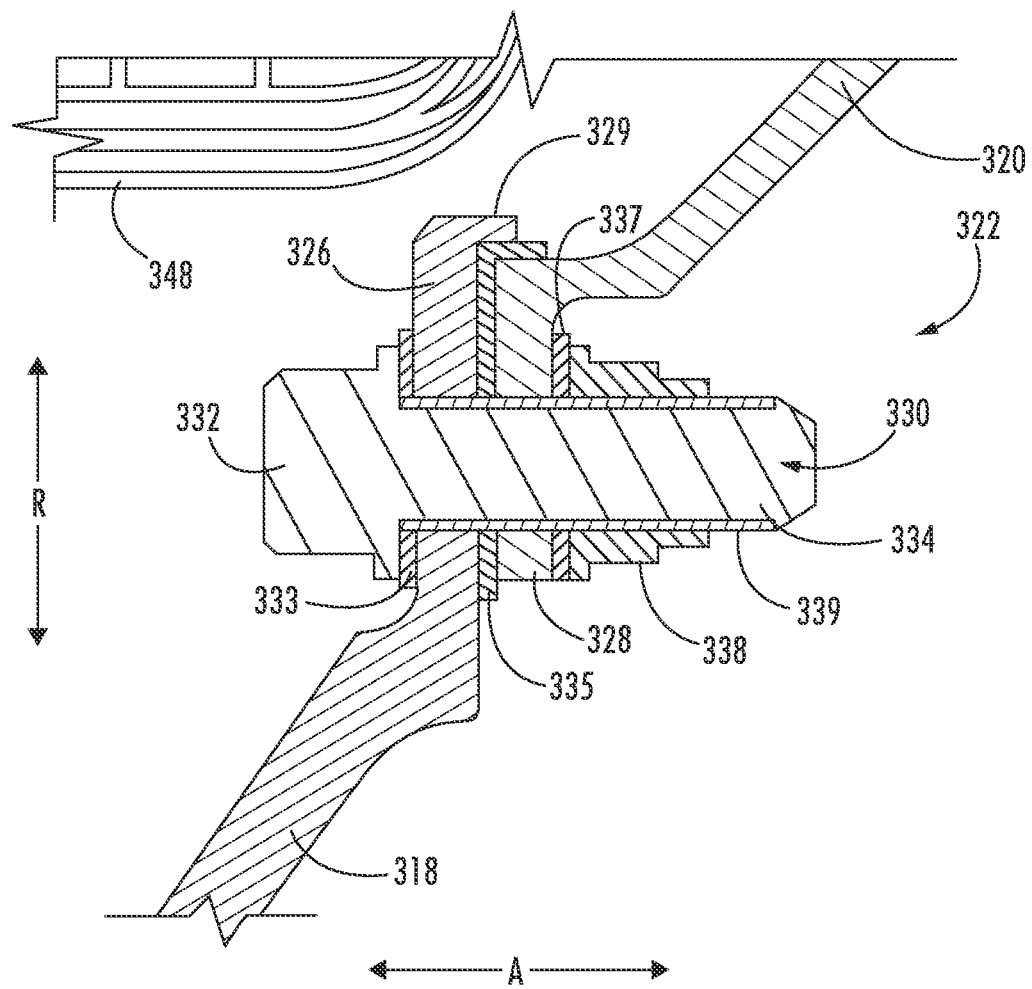
FIG. 6 provides a close-up, cross-sectional view of an insulated joint of a rotor assembly of the electric machine taken from Section 5 of FIG. 4.

Under the second prong, with reference to FIGS. 4 and 5, the common mode current conductive path between the rotor 312 of the electric machine 300A and the low speed shaft 246 can be interrupted by insulated joint 322. FIG. 6 provides a close-up, cross-sectional view of the insulated joint 322 taken from Section 5 of FIG. 4. As depicted, the insulated joint 322 is an insulated bolted joint in this embodiment. The insulated joint 322 is collectively formed by a bolt 330, various insulative components, and components of the rotor connection assembly 316.

As shown best in FIG. 6, the rotor hub 318 includes a hub flange 326 and the rotor connection member 320 includes a connection flange 328. The hub flange 326 extends in a plane orthogonal to the axial direction A. Likewise, the connection flange 328 extends in a plane orthogonal to the axial direction A. The hub flange 326 and the connection flange 328 are in communication with one another so that bolt 330 may extend through the hub flange 326 and the connection flange 328. More particularly, the hub flange 326 defines an aperture that is in communication with an aperture defined by the connection flange 328. The bolt 330 extends through the aperture defined by the hub flange 326 and through the aperture defined by the connection flange 328 to secure the rotor connection member 320 with the rotor hub 318. A nut 338 can be threaded onto the bolt 330 to further secure the rotor connection member 320 with the rotor hub 318.

The bolt 330 has a head 332 and a shank 334 extending from the head 332. The head 332 has a larger diameter than the shank 334. For this embodiment, the head 332 of the bolt 330 is positioned on the hub flange side of the insulated joint 322. The shank 334 of the bolt 330 extends through the hub flange 326 and the connection flange 328 and a distal end of the shank 334 is positioned on the connection flange side of the insulated joint 322. As depicted, the nut 338 is secured to the portion of the shank 334 positioned on the connection flange side of the insulated joint 322. In this regard, the head 332 of the bolt 330 and the nut 338 clamp or otherwise couple the rotor hub 318 and the rotor connection member 320 together. The bolt 330 and the nut 338 may be formed of an electrically conductive material, such as a suitable metallic material. In other embodiments, the head 332 of the bolt 330 and the nut 338 may be positioned on opposite sides than what is shown in FIG. 6.

As further shown in FIG. 6, the insulated joint 322 includes a plurality of insulative members. Each of the insulative members are formed of an electrically insulative material, such as a ceramic material. Generally, the insulative members electrically isolate the rotor connection member 320 and the rotor hub 318, and thus, the rotor 312 is electrically isolated from the low speed shaft 246. In this regard, the common mode current conductive path between the rotor 312 of the electric machine 300A and the low speed shaft 246 can be interrupted by insulated joint 322.

For the depicted embodiment of FIG. 6, the insulative members include a hub shim 333, an interface shim 335, and a connection shim 337. As noted above, each insulative member, including the hub shim 333, interface shim 335, and connection shim 337, is formed of an insulative material. The hub shim 333 is positioned between the head 332 of the bolt 330 and the hub flange 326, e.g., along the axial direction A. The hub shim 333 extends a distance along the radial direction R so that the head 332 of the bolt 330 does not physically contact the hub flange 326 of the rotor hub 318 as shown in FIG. 6.

Generally, the interface shim 335 is positioned between the rotor hub 318 and the rotor connection member 320 so that they do not physically contact one another. Particularly, as depicted, the interface shim 335 is positioned between the hub flange 326 of the rotor hub 318 and the connection flange 328 of the rotor connection member 320, e.g., along the axial direction A. In addition, for this embodiment, the interface shim 335 is also positioned between an outer member 329 of the hub flange 326 and the rotor connection member 320, e.g., along the radial direction R. In this manner, the interface shim 335 has an L-shaped cross-section in this example embodiment. However, in other example embodiments, the interface shim 335 may have any suitable cross-sectional shape.

The connection shim 337 is positioned between the connection flange 328 and the nut 338, e.g., along the axial direction A. The connection shim 337 extends a distance along the radial direction R so that the nut 338 does not physically contact the connection flange 328 of the rotor connection member 320 as shown in FIG. 6.

The hub shim 333, the interface shim 335, and the connection shim 337 may each define an aperture. The apertures defined by the shims 333, 335, 337 may be in communication with one another as well as the apertures defined by the hub flange 326 and the connection flange 328. In this manner, the bolt 330 may extend through the hub shim 333, the hub flange 326, the interface shim 335, the connection flange 328, and the connection shim 337. The bolt 330 may also extend through and may be threadingly engaged with the nut 338.

Furthermore, for this embodiment, the threads or circumference of the shank 334 of the bolt 330 is coated with an insulative coating 339, such as a ceramic coating. As depicted in FIG. 6, the insulative coating 339 may extend substantially along the axial length of the shank 334. The shank 334 may engage (e.g., threadingly engage) the hub flange 326, the connection flange 328, and the nut 338, all of which may be formed of electrically conductive material. The insulative coating 339 on the bolt 330 prevents electric current from flowing between these electrically conductive elements. In this way, the insulative coating 339 on the bolt 330 and the insulative members, including the hub shim 333, the interface shim 335, and the connection shim 337, collectively electrically isolate the rotor connection member 320 from the rotor hub 318. As a result, the common mode current conductive path between the rotor 312 of the electric machine 300A and the low speed shaft 246 can be interrupted by insulated joint 322. Advantageously, this prevents common mode electric current from reaching the bearings 290 (FIG. 2) supporting the low speed shaft 246, among other benefits.

In some alternative embodiments, the entire outer surface of the bolt 330 can be coated with the insulative coating 339. In yet other embodiments, the bolt 330 is not coated with the insulative coating 339 but rather an insulative sleeve (not shown) may extend circumferentially around and axially along the shank 334 of the bolt 330 so that the bolt 330 does not engage the other electrically conductive components of the insulated joint 322.

In some further embodiments, the hub flange 326 and the connection flange 328 can be coated with the insulative coating 339, particularly around the circumference of the apertures 317, 319 through which the bolt 330 extends. The hub flange 326 and the connection flange 328 can be coated with the insulative coating 339 in addition or alternatively to the bolt 330 being coated with the insulative coating 339. In yet other embodiments, the insulated joint 322 does not include any insulative members but rather the bolt 330, the nut 338, and the flanges 326, 328 are all coated with the insulative coating 339 where they physically engage one another. The insulative coating 339 can be applied using a suitable technique, such as by electrophoretic deposition or via an electrostatic coating process. Such techniques can provide an insulation power coating on the desired surfaces ultimately to electrically isolate the rotor connection member 320 and the rotor hub 318 so that the rotor 312 is electrically isolated from the low speed shaft 246. In this way, the common mode current conductive path between the rotor 312 of the electric machine 300A and the low speed shaft 246 can be interrupted by insulated joint 322.

In some further embodiments, the rotor hub 318 and/or the rotor connection member 320 can include one or more insulative layers. For the depicted embodiment of FIG. 7, for example, the hub flange 326 includes a plurality of double-layered insulative layers, including hub-side insulative layers, interface-side insulative layers, and aperture insulative layers. In FIG. 7, the bolt 330 and associated nut 338 (see FIG. 6) are removed for illustrative clarity. The hub-side insulative layers include an outer layer 400 and an inner layer 402. The outer layer 400 forms the outer surface of the hub-side of the hub flange 326. A metallic layer 404 is sandwiched or positioned between the outer layer 400 and the inner layer 402, e.g., along the axial direction A. The interface-side insulative layers include an outer layer 410 and an inner layer 412. The outer layer 410 forms the outer surface of the interface-side of the hub flange 326. The outer layer 410 and the inner layer 412 may also extend along the outer member 329 of the hub flange 326. A metallic layer 414 is sandwiched or positioned between the outer layer 410 and the inner layer 412, e.g., along the axial direction A and along the radial direction R along the outer member 329 of the hub flange 326. In addition, the aperture insulative layers include an outer layer 420 and an inner layer 422. The aperture insulative layers generally extend circumferentially around the circumference of aperture 317 defined by the hub flange 326 of the rotor hub 318. A metallic layer 424 is sandwiched or positioned between the outer layer 420 and the inner layer 422, e.g., along the radial direction R. In some embodiments, the aperture insulative layers may include only a single layer (e.g., the outer layer 420) extending circumferentially along the circumference defining the aperture 317. Each insulative layer of the rotor hub 318 can be formed of an electrically insulative material, such as a ceramic material.

As further depicted in FIG. 7, the connection flange 328 includes connection-side insulative layers, interface-side insulative layers, and aperture insulative layers. The connection-side insulative layers include an outer layer 430 and an inner layer 432. The outer layer 430 forms the outer surface of the connection-side of the connection flange 328. A metallic layer 434 is sandwiched or positioned between the outer layer 430 and the inner layer 432, e.g., along the axial direction A. The interface-side insulative layers include an outer layer 440 and an inner layer 442. The outer layer 440 forms the outer surface of the interface-side of the connection flange 328. The outer layer 440 and the inner layer 442 may also extend lengthwise along the axial direction A so as to extend complementary to the interface insulative layers 410, 412 extending along the outer member 329 of the hub flange 326. A metallic layer 444 is sandwiched or positioned between the outer layer 440 and the inner layer 442. Furthermore, the aperture insulative layers include an outer layer 450 and an inner layer 452. The aperture insulative layers generally extend circumferentially around the circumference of aperture 319 defined by the connection flange 328 of the rotor connection member 320. A metallic layer 454 is sandwiched or positioned between the outer layer 450 and the inner layer 452, e.g., along the radial direction R. In some embodiments, the aperture insulative layers may include only a single layer (e.g., the outer layer 450) extending circumferentially along the circumference defining the aperture 319. Each insulative layer of the rotor connection member 320 can be formed of an electrically insulative material, such as a ceramic material.

Notably, the strategic arrangement of the insulative layers of the rotor hub 318 and the rotor connection member 320 can electrically isolate the rotor connection member 320 and the rotor hub 318, and thus, the rotor 312 is electrically isolated from the low speed shaft 246. In this regard, the common mode current conductive path between the rotor 312 of the electric machine 300A and the low speed shaft 246 can be interrupted by insulated joint 322. Moreover, in such embodiments, the bolt 330 and corresponding nut 338 (not pictured in FIG. 7; see FIG. 6) can but need not be coated with an insulative material. Further, in such embodiments, insulative members, such as the insulative shims of FIG. 6, can but need not be arranged between components as shown in FIG. 6. Further, the double-layered arrangement of the insulative layers depicted in FIG. 7 allows for an outer layer to be easily replaced when worn and also provides an extra layer of insulation, among other benefits.

In some alternative embodiments, as shown in FIG. 8, the hub flange 326 and the connection flange 328 both include a plurality of single-layered insulative layers. Particularly, the hub flange 326 includes a hub-side insulative layer 460, an interface-side insulative layer 462, and an aperture insulative layer 464. The connection flange 328 includes a connection-side insulative layer 466, an interface-side insulative layer 468, and an aperture insulative layer 470. Each insulative layer of the rotor hub 318 and the rotor connection member 320 can be formed of an electrically insulative material, such as a ceramic material. In FIG. 8, the bolt 330 and associated nut 338 (see FIG. 6) are removed for illustrative clarity.

Notably, due to the strategic arrangement of the insulative layers 460, 462, 464, 466, 468, 470, the rotor hub 318 and the rotor connection member 320 can electrically isolate the rotor connection member 320 and the rotor hub 318, and thus, the rotor 312 is electrically isolated from the low speed shaft 246. In this regard, the common mode current conductive path between the rotor 312 of the electric machine 300A and the low speed shaft 246 can be interrupted by insulated joint 322. Moreover, the bolt 330 and corresponding nut 338 (not pictured in FIG. 8; see FIG. 6) can but need not be coated with an insulative material. Further, in such embodiments, insulative members, such as the insulative shims of FIG. 6, can but need not be arranged between components as shown in FIG. 6.

Under the third prong for mitigating bearing electric currents, with reference again to FIG. 4, at least one of the members connecting the rotor 312 of the electric machine 300A and the low speed shaft 246 is electrically grounded by a grounding device 360. For instance, as shown in FIG. 4, the grounding device 360 is shown electrically grounding the rotor hub 318, which as noted previously, is a member that connects the rotor 312 of the electric machine 300A and the low speed shaft 246. By electrically grounding the rotor hub 318, the bearings 290 (FIG. 2) supporting the low speed shaft 246 can be protected from common mode electric current surges or electrical overloads associated with the electric machine 310A, among other benefits.

As depicted in FIG. 4, the grounding device 360 can be electrically connected to the rotor hub 318 and a transmission cable 352 can electrically connect the grounding device 360 and a ground point, such as a grounding system 350 (shown schematically in FIG. 4). The grounding system 350 can be any suitable grounding system, such as an aircraft grounding system. For instance, on an aircraft having a high electrically conductive fuselage, such as an aluminum fuselage, the grounding system 350 can be the fuselage itself. On an aircraft having a fuselage having an insulating or low electrically conductive fuselage, such as a carbon fiber fuselage, an internal metallic structure within the fuselage or other components of the aircraft, such as the wings, tail cone, or empennage of the aircraft, can be used for the grounding system 350.

For this embodiment, the grounding device 360 includes a stationary component 362 connected to a structure of the engine 210A, a rotating component 364 operatively coupled with and rotatable with the rotor hub 318, and one or more electrical contacts 366 connected to one or both of the stationary component 362 and the rotating component 364. The electrical contacts 366 can be grounding brushes formed of an electrically conductive material, such as metal or carbon. The electrical contacts 366 allow electric current to flow between the stationary component 362 and the rotating component 364 to facilitate grounding of the rotor hub 318. The transmission cable 352 is electrically connected to the electrical contacts 366, and thus, the electrical contacts 366 are electrically coupled with the grounding system 350.

Notably, the grounding device 360 can be integrated into an existing component of the gas turbine engine 210A. For instance, in some embodiments, the grounding device 360 is integrated into a resolver operable to measure degrees of rotation or angular position of the rotor hub 318 and the low speed shaft 246 operatively coupled thereto. Moreover, as the low speed shaft 246, rotor hub 318, and rotating component 364 rotate about the central longitudinal axis 214, electrical contacts 366 connected to the stationary component 362 can contact the rotating component 364 coupled with the rotor hub 318 to provide an electrical grounding pathway. In this manner, the rotor hub 318 and low speed shaft 246 can be electrically grounded. The electrical contacts 366 can be grounding brushes, as noted above. In this regard, a grounding brush can be integrated into the resolver.

Accordingly, in such embodiments, the resolver has dual functionality in that it is operable to provide the grounding connection point for electrically grounding the rotor hub 318 and low speed shaft 246 and it measures degrees of rotation or angular position of the rotor hub 318 and the low speed shaft 246. Integrating the electrical grounding functionality into a resolver can reduce the number of parts required for electrically grounding the rotor hub 318 and low speed shaft 246, can reduce the weight of the first propulsor 200A (FIG. 1) and thus the weight of the aircraft 100 (FIG. 1), and can be an efficient use of space.

In alternative example embodiments, the grounding device 360 can be integrated into other suitable components. For instance, in some embodiments, the grounding device 360 can be integrated into an encoder operable to measure a rotational speed of the rotor hub 318 and the low speed shaft 246 operatively coupled thereto. Moreover, as the low speed shaft 246, rotor hub 318, and rotating component 364 rotate about the central longitudinal axis 214, electrical contacts 366 connected to the stationary component 362 of the encoder can contact the rotating component 364 of the encoder coupled with the rotor hub 318 to provide an electrical grounding pathway. In this manner, the rotor hub 318 and low speed shaft 246 can be electrically grounded. The electrical contacts 366 can be grounding brushes, as noted above. In this regard, a grounding brush can be integrated into the encoder.

Accordingly, in such embodiments, the encoder has dual functionality in that it is operable to provide the grounding connection point for electrically grounding the rotor hub 318 and low speed shaft 246 and it measures rotational speed of the rotor hub 318 and the low speed shaft 246. Integrating the electrical grounding functionality into an encoder can reduce the number of parts required for electrically grounding the rotor hub 318 and low speed shaft 246, can reduce the weight of the first propulsor 200A (FIG. 1) and thus the weight of the aircraft 100 (FIG. 1), and can be an efficient use of space.

As further depicted in FIG. 4, in some embodiments, the shaft electric current and/or shaft voltage can be measured by one or more sensors, represented by sensor 380. The sensor 380 can be integrated into the grounding brush circuitry of the grounding device 360, for example. The measured shaft electric current and/or shaft voltage can be provided to controller 182 and/or other computing or control devices, e.g., for facilitating control of the electric machine 300A and/or the gas turbine engine 210A.

Figure 9:
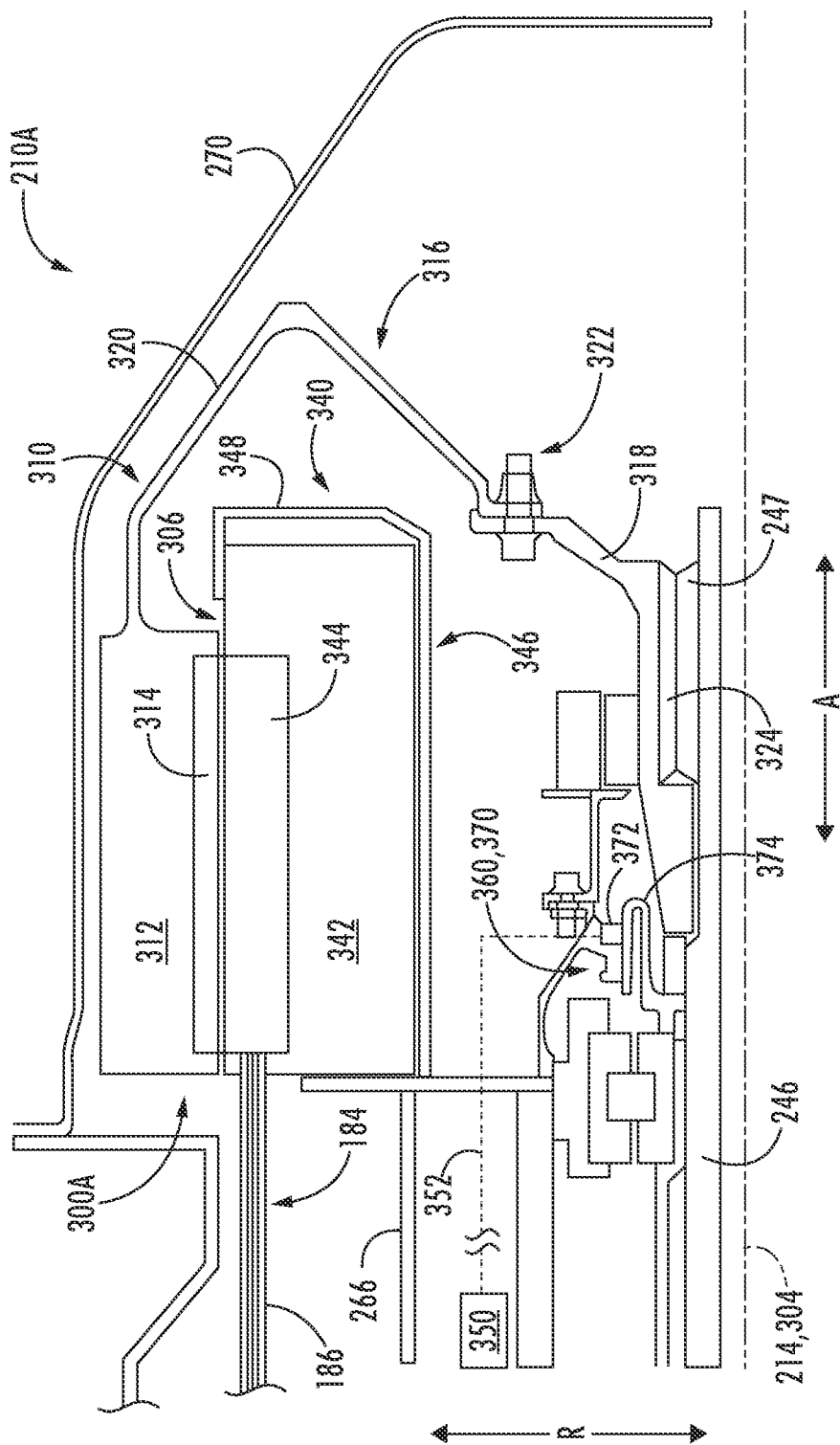
FIG. 9 provides a schematic cross-sectional view of an electric machine embedded in a gas turbine engine according to various exemplary embodiments of the present disclosure.

Further, in some embodiments, the grounding device 360 can be integrated into an existing seal of the gas turbine engine 210A. The grounding device 360 can be integrated into any suitable type of existing seal, such as a carbon seal, including end face and radial carbon seals, a finger seal, a brush seal, a labyrinth seal, etc. For instance, as an alternative to the grounding device 360 being integrated into the resolver or encoder depicted in FIG. 4, the grounding device 360 can be integrated into a carbon seal 370 as depicted in FIG. 9. The carbon seal 370 can be configured to seal a fluid (e.g., oil or air) within a chamber. The carbon seal 370 can include a stationary component and a rotating component. For this embodiment, the stationary component is a stationary carbon element 372 connected to a stationary structure of the engine 210A and the rotating component is a ring 374 rotatable with a rotating shaft, which is the low speed shaft 246 in this example embodiment. The ring 374 can be formed of an electrically conductive material, such as a metallic material. Likewise, the state of the carbon element 372 can be such that it is also electrically conductive. In some alternative embodiments, the grounding element, which in this example embodiment is carbon element 372, can be formed of a material other than carbon. For instance, the grounding element can be formed of any suitable material that is electrically conductive and that has similar wear characteristics to carbon. The grounding element can be formed of a suitable composite, mixture, alloy, metal, or other material, for example.

Further, as depicted in FIG. 9, the carbon element 372 and/or stationary structure to which the carbon element 372 is mounted can be electrically connected to a dedicated grounding system, such as grounding system 350. Transmission line 352 can be electrically connected to the carbon element 372 or an adjacent structure electrically coupled with the carbon element 372. In this manner, the grounding system 350 can be used to electrically ground the low speed shaft 246. In yet other embodiments, the carbon element 372 and/or its adjacent structures can provide the grounding system.

Accordingly, as the low speed shaft 246, rotor hub 318, and ring 374 rotate about the central longitudinal axis 214, an electrical grounding pathway is created between the ring 374 and the carbon element 372 (the electric current pathway may extend through fluid flowing therebetween). Thus, electric current may flow between the ring 374 and the carbon element 372. In this manner, the low speed shaft 246 as well as the rotor hub 318 can be electrically grounded. Accordingly, in such embodiments, the carbon seal 370 has dual functionality in that it is operable to provide the grounding connection point for electrically grounding the low speed shaft 246 and the rotor hub 318 operatively coupled thereto and is operable to seal fluid within a chamber. Integrating the electrical grounding functionality into carbon seal 370 can reduce the number of parts required for electrically grounding the rotor hub 318 and low speed shaft 246, can reduce the weight of the first propulsor 200A (FIG. 1) and thus the weight of the aircraft 100 (FIG. 1), and can be an efficient use of space, among other benefits.

Figure 10:
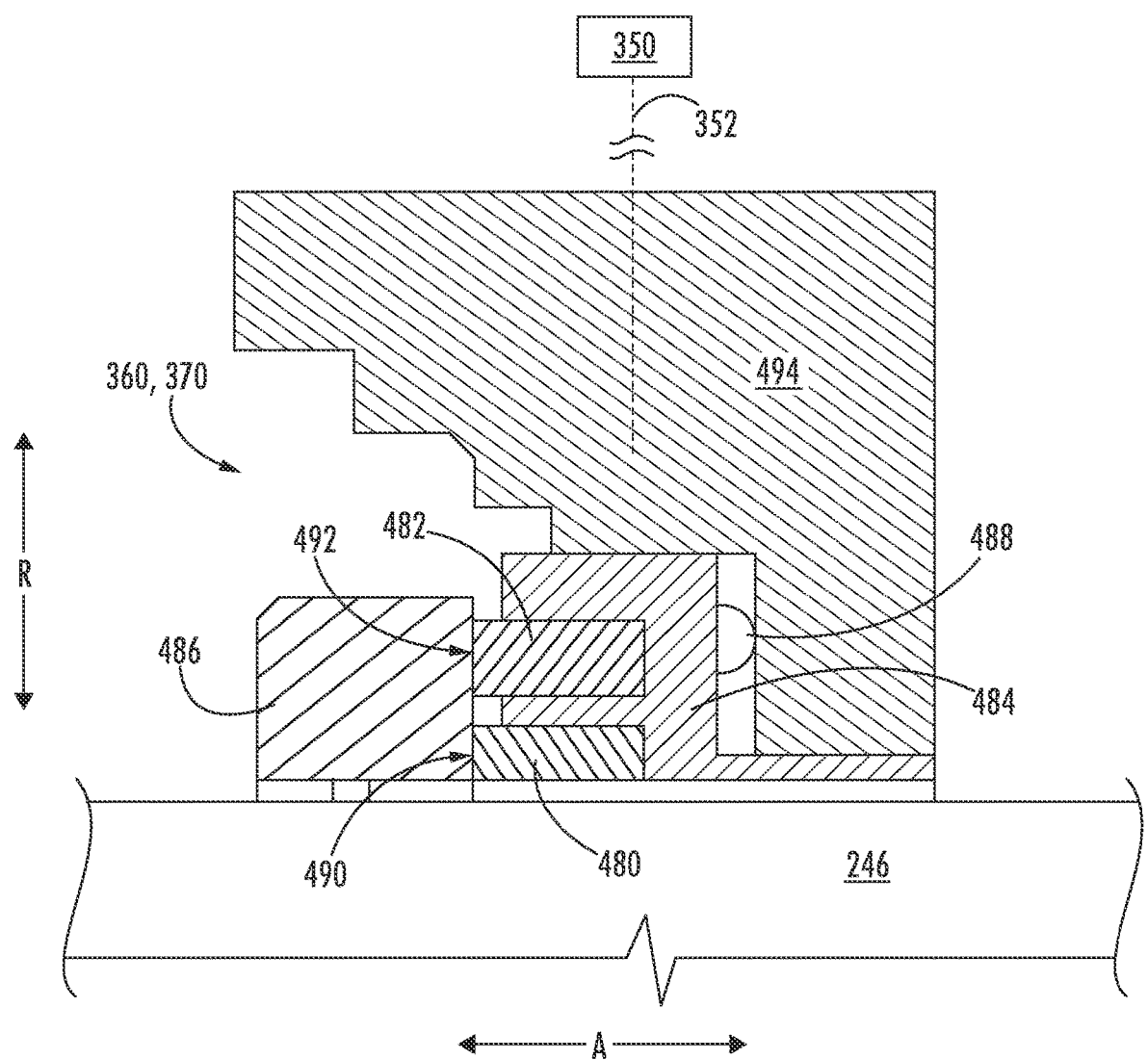
FIG. 10 provides a close-up, cross-sectional view of a grounding device integrated into a carbon seal according to one example embodiment of the present disclosure.

FIG. 10 provides a close-up, cross-sectional view of another example grounding device 360 integrated into a carbon seal 370 according to one example embodiment of the present disclosure. For this embodiment, carbon seal 370 is an end face carbon seal. As depicted, the carbon seal 370 includes a plurality of stationary components and a rotating component. Particularly, for this example embodiment, the stationary components include a first carbon element 480 and a second carbon element 482. Both the first carbon element 480 and the second carbon element 482 can be formed of an electrically conductive carbon material. In some alternative embodiments, the grounding elements, which in this example embodiment is first carbon element 480 and second carbon element 482, can be formed of a material other than carbon. For instance, the grounding elements can be formed of any suitable material that is electrically conductive and that has similar wear characteristics to carbon. The grounding elements can be formed of a suitable composite, mixture, alloy, metal, or other material, for example.

The second carbon element 482 is positioned outward of the first carbon element 480 along the radial direction R. The first carbon element 480 and the second carbon element 482 can be carbon rings, for example. The first carbon element 480 and the second carbon element 482 can be carried or held in position by a seal holder 484, which is also a stationary component. The second carbon element 482 is positioned between two flanges of the seal holder 484 along the radial direction R while the first carbon element 480 is positioned inward of the two flanges of the seal holder 484 along the radial direction R.

The rotating component is a seal runner 486 that is coupled to and rotatable with the low speed shaft 246. In some alternative embodiments, the seal runner 486 can be coupled with the rotor hub 318. The seal runner 486 can be formed of an electrically conductive material, such as a metallic material. As illustrated, a spring 488 is positioned between the seal holder 484 and a seal housing 494, e.g., along the axial direction A. The spring 488 applies a force on the seal holder 484, which biases the first carbon element 480 and the second carbon element 482 in contact with the seal runner 486. As shown in FIG. 10, a face 490 of the first carbon element 480 engages the seal runner 486 and a face 492 of the second carbon element 482 engages the seal runner 486. The face 492 of the second carbon element 482 engages the seal runner 486 with more surface area than which the face 490 of the first carbon element 480 engages the seal runner 486.

Accordingly, as the low speed shaft 246 and seal runner 486 rotate about the central longitudinal axis 214 (FIG. 9), a first electrical grounding pathway is created between the seal runner 486 and the first carbon element 480 and a second electrical grounding pathway is created between the seal runner 486 and the second carbon element 482. Thus, electric current may flow between the seal runner 486 and the first and second carbon elements 480, 482 along these pathways. The seal housing 494 may provide the grounding system in some embodiments, or alternatively, the seal housing 494 may be electrically connected to a dedicated grounding system 350 via transmission line 352. In this manner, the low speed shaft 246, as well as the rotor hub 318 (FIG. 9), can be electrically grounded.

Thus, in such embodiments, the carbon seal 370 has dual functionality in that it is operable to provide grounding connection points for electrically grounding the low speed shaft 246 and the rotor hub 318 operatively coupled thereto and is operable to seal fluid within a chamber. The engagement of the first carbon element 480 with the seal runner 486 provides sealing functionality along with a first grounding pathway while the engagement of the second carbon element 482 provides a second grounding pathway and increases the number of electrical connection points with the seal runner 486, which may provide improved electrical grounding of the low speed shaft 246. Integrating the electrical grounding functionality into the carbon seal 370 of FIG. 10 can reduce the number of parts required for electrically grounding the rotor hub 318 and low speed shaft 246, can reduce the weight of the first propulsor 200A (FIG. 1) and thus the weight of the aircraft 100 (FIG. 1), and can be an efficient use of space, among other benefits.

Figure 11:
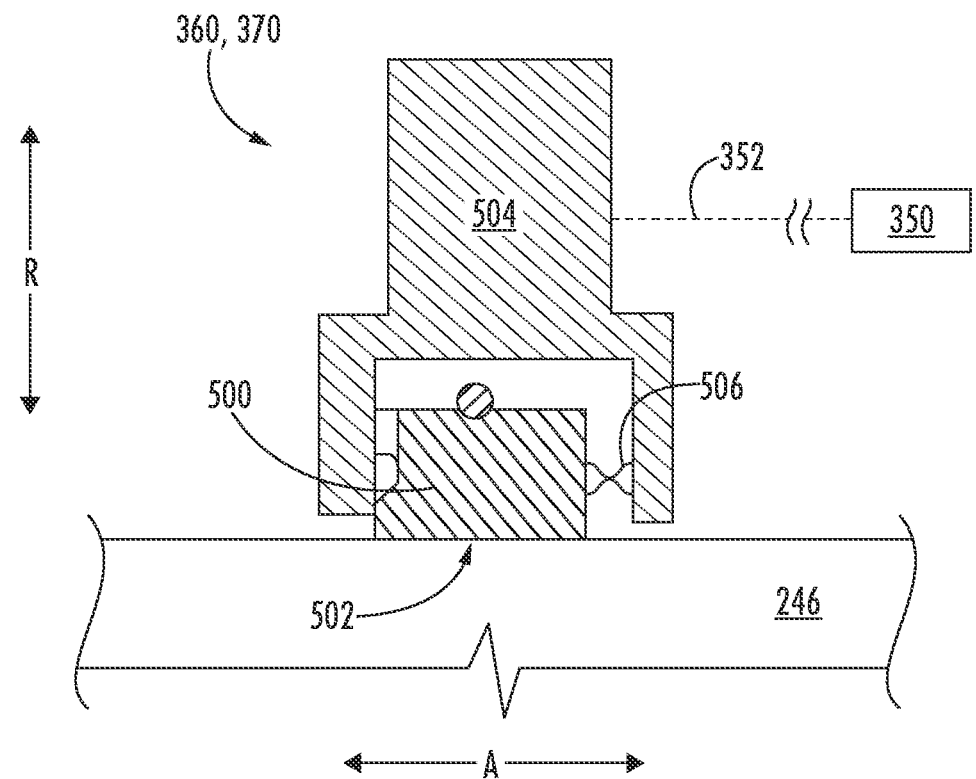
FIG. 11 provides a close-up, cross-sectional view of a grounding device integrated into a carbon seal according to another example embodiment of the present disclosure.

FIG. 11 provides a close-up, cross-sectional view of a grounding device 360 integrated into a carbon seal 370 according to another example embodiment of the present disclosure. For this embodiment, carbon seal 370 is a radial carbon seal. As depicted, the carbon seal 370 includes a carbon element 500 that has a face 502 that directly engages the low speed shaft 246. In alternative embodiments, the face 502 can engage the rotor hub 318 of the rotor connection assembly 316 (FIG. 9). The carbon element 500 can be formed of an electrically conductive carbon material. The carbon element 500 is carried or held by a seal holder 504, which may be mechanically coupled with various support structures. A spring 506 is positioned between the seal holder 504 and the carbon element 500. The spring 506 biases the carbon element 500 into the desired axial position.

As the low speed shaft 246 rotates about the central longitudinal axis 214 (FIG. 9), an electrical grounding pathway is created between the low speed shaft 246 and the carbon element 500. Thus, electric current may flow between the low speed shaft 246 and the carbon element 500. The seal holder 504 may provide the grounding system in some embodiments, or alternatively as shown in FIG. 11, the seal holder 504 may be electrically connected to a dedicated grounding system 350 via transmission line 352. In this manner, the low speed shaft 246, as well as the rotor hub 318 (FIG. 9), can be electrically grounded. Integrating the electrical grounding functionality into the carbon seal 370 of FIG. 11 can reduce the number of parts required for electrically grounding the rotor hub 318 and low speed shaft 246, can reduce the weight of the first propulsor 200A (FIG. 1) and thus the weight of the aircraft 100 (FIG. 1), and can be an efficient use of space, among other benefits.

Figure 12:
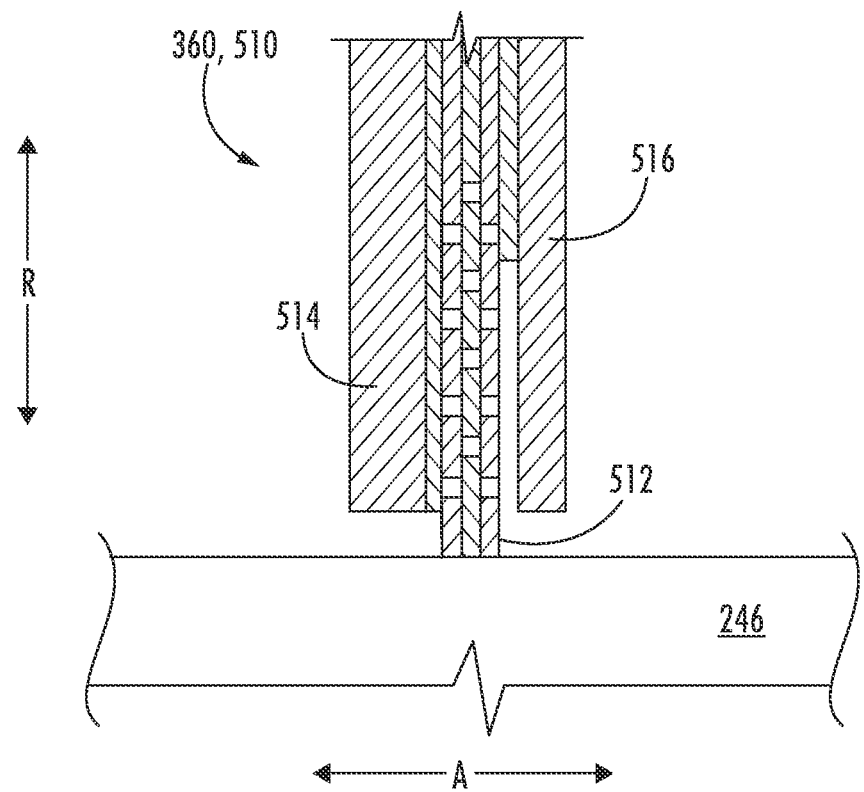
FIG. 12 provides a close-up, cross-sectional view of a grounding device integrated into a carbon seal according to yet another example embodiment of the present disclosure.

FIG. 12 provides a close-up, cross-sectional view of a grounding device 360 integrated into a finger seal 510 according to an example embodiment of the present disclosure. As depicted, the finger seal 510 includes a stack or plurality of finger elements 512. The plurality of finger elements 512 are positioned between a first plate 514 and a second plate 516, e.g., along the axial direction A. The finger elements 512 and the first plate 514 and second plate 516 can be clamped or secured together in any suitable manner, e.g., by one or more mechanical fasteners. The plates 514, 516 can be formed of an electrically conductive material, such as a metallic material. The finger elements 512 extend along the radial direction R so as to contact the low speed shaft 246. In alternative embodiments, the finger elements 512 can extend to contact other rotating elements coupled with the low speed shaft 246, such as the rotor hub 318 (FIG. 9). The finger elements 512 can be formed of a flexible material. In this manner, the finger elements 512 can accommodate displacement and/or deformation of the low speed shaft 246 whilst maintaining contact thereto. Moreover, the flexible material used for the finger elements 512 can also be an electrically conductive material.

In this regard, as the low speed shaft 246 rotates about the central longitudinal axis 214 (FIG. 9), an electrical grounding pathway is created between the low speed shaft 246 and the finger elements 512 of the finger seal 510. Thus, electric current may flow between the low speed shaft 246 and the finger elements 512. The plates 514, 516 may provide the grounding system in some embodiments, or alternatively, the plates 514, 516 may be electrically connected to a dedicated grounding system 350 via transmission line 352 as shown in FIG. 12. In this manner, the low speed shaft 246, as well as the rotor hub 318 (FIG. 9), can be electrically grounded. Integrating the electrical grounding functionality into the finger seal 510 of FIG. 12 can reduce the number of parts required for electrically grounding the rotor hub 318 and low speed shaft 246, can reduce the weight of the first propulsor 200A (FIG. 1) and thus the weight of the aircraft 100 (FIG. 1), and can be an efficient use of space, among other benefits.

Figure 13:
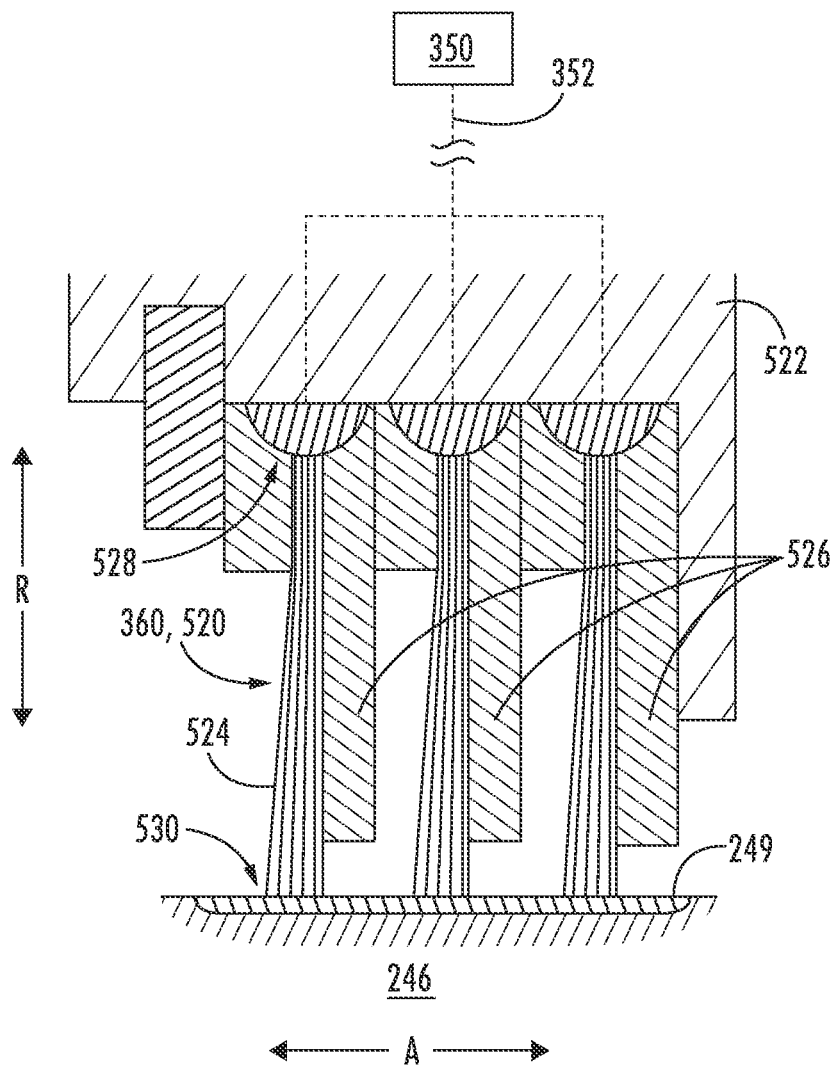
FIG. 13 provides a close-up view of an example brush seal integrated as a grounding device according to various exemplary embodiments of the present disclosure.

In yet other embodiments, as noted above, the grounding device 360 can be integrated into a brush seal, such as brush seal 520 depicted in FIG. 13. The brush seal 520 can be configured to seal a fluid (e.g., oil or air) within a chamber. As shown in FIG. 13, the brush seal 520 includes a housing 522 spaced from the low speed shaft 246, e.g., along the radial direction R. The brush seal 520 also includes one or more brushes. For this embodiment, the brush seal 520 includes a plurality of brushes 524. Each brush 524 includes a plurality of filaments. The filaments can be formed of an electrically conductive material, such as a metallic material. Walls 526 can be positioned between adjacent brushes 524, e.g., along the axial direction A. Further, each brush 524 extends between a proximal end 528 and a distal end 530, e.g., along the radial direction R. The brushes 524 are attached to the housing 522 at their respective proximal ends 528. The brushes 524 are engaged with the low speed shaft 246 at their respective distal ends 530. Notably, the low speed shaft 246 can include a wear resistant coating 249 along its outer circumference as shown in FIG. 13. The wear resistant coating 249 can prevent damage to the low speed shaft 246 due to engagement of the brushes 524 therewith. In some embodiments, the brushes 524 can be electrically connected to the grounding system 350 via the transmission line 352.

Accordingly, as the low speed shaft 246 and rotor hub 318 rotate about the central longitudinal axis 214 (FIG. 2) and the brushes 524 engage the low speed shaft 246, an electrical grounding pathway is created between the brushes 524 and the low speed shaft 246. Thus, electric current may flow between the low speed shaft 246 and the brushes 524. In this manner, the low speed shaft 246 as well as the rotor hub 318 can be electrically grounded. Accordingly, in such embodiments, the brush seal 520 has dual functionality in that it is operable to provide the grounding connection point for electrically grounding the low speed shaft 246 and the rotor hub 318 operatively coupled thereto and is operable to seal fluid within a chamber. Integrating the electrical grounding functionality into brush seal 520 can reduce the number of parts required for electrically grounding the rotor hub 318 and low speed shaft 246, can reduce the weight of the first propulsor 200A (FIG. 1) and thus the weight of the aircraft 100 (FIG. 1), and can be an efficient use of space, among other benefits.

Figure 14:
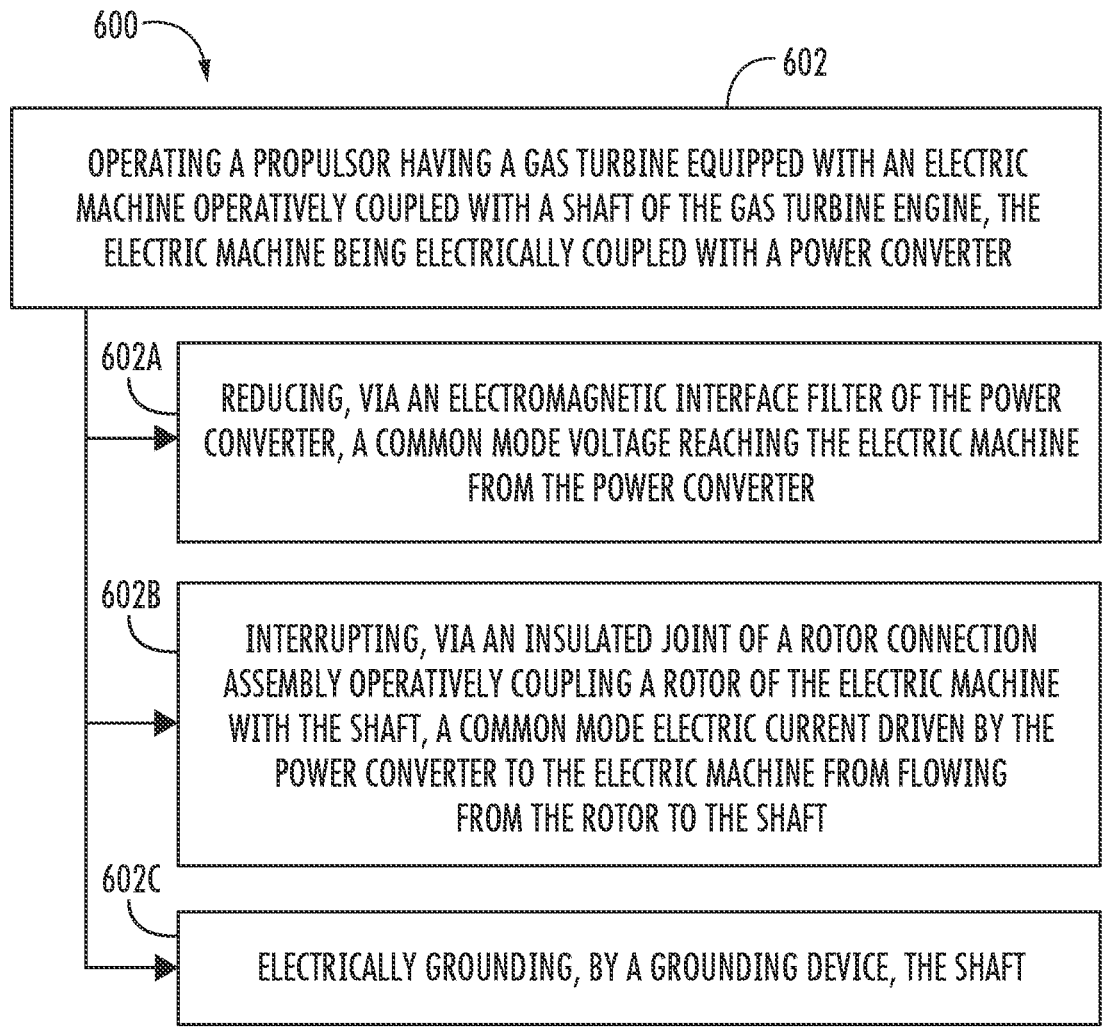
FIG. 14 provides a flow diagram for a method of operating a hybrid-electric propulsor according to various exemplary embodiments of the present disclosure.

FIG. 14 provides a flow diagram for a method (600) of operating a hybrid-electric propulsor according to one example embodiment of the present disclosure. For instance, method (600) can be used to operate one or both of the propulsors 200A, 200B disclosed herein or any other propulsor having a gas turbine engine equipped with an embedded electric machine operatively coupled with a shaft of the engine. It will be appreciated that method (600) is discussed herein to describe exemplary aspects of the present subject matter and is not intended to be limiting.

At (602), the method (600) includes operating a propulsor having a gas turbine engine equipped with an electric machine operatively coupled with a shaft of the gas turbine engine, the electric machine being electrically coupled with a power converter. For instance, the propulsor can be the first propulsor 200A disclosed herein. The electric machine can be embedded within the core of the gas turbine engine can be mechanically coupled with a shaft, such as a low speed shaft, a high-speed shaft, or any other suitable shaft of the gas turbine engine. One or more bearings may support the shaft. During operation, the shaft is rotated about its axis of rotation, and as the rotor of the electric machine is operatively coupled with the shaft, the rotor rotates in unison with the shaft. In some implementations, the electric machine may operate in a drive or motor mode. In the drive mode, the power converter provides electrical power to the electric machine, which causes the electric machine to drive the shaft. In some implementations, the electric machine may operate in a generator mode. In the generator mode, the shaft drives the rotor, causing the electric machine to generate electrical power. The generated electrical power can then be provided to the power converter and ultimately to one or more electrical loads. As electric power is transmitted between the power converter and the electric machine, common mode voltage can drive common mode electric currents through the electric machine and through electrically conductive components associated with the electric machine.

At (602A), in some implementations, in operating the propulsor at (602), the method (600) includes reducing, via an electromagnetic interface filter of the power converter, a common mode voltage reaching the electric machine from the power converter. For instance, an EMI filter of the power converter associated with the propulsor can reduce the common mode voltage reaching the electric machine. In addition, in some implementations, one or more shielded cables or bus bars can further reduce the common mode voltage reaching the electric machine.

At (602B), in some implementations, in operating the propulsor at (602), the method (600) includes interrupting, via an insulated joint of a rotor connection assembly operatively coupling a rotor of the electric machine with the shaft, a common mode electric current driven by the power converter to the electric machine from flowing from the rotor to the shaft. For instance, the insulated joint can be embodied in any of the configurations provided herein. As one example, the insulated joint can mechanically couple a rotor connection member connected to a rotor of the electric machine and a rotor hub connected to the shaft. The insulated joint cannot only mechanically couple the rotor connection member and the rotor hub, but it may also electrically isolate the rotor and the shaft. In this regard, the insulated joint interrupts common mode electric current from flowing from the rotor to the shaft. Advantageously, this prevents common mode electric currents from reaching the one or more bearings supporting the shaft.

At (602C), in some implementations, in operating the propulsor at (602), the method (600) includes electrically grounding, by a grounding device, the shaft. For instance, the grounding device can be embodied in any of the configurations provided herein. As one example, the grounding device can be configured as shown in FIG. 4. Particularly, the grounding device can have a stationary component, a rotating component connected to the shaft or some other component rotatable with the shaft, and one or more electrical contacts providing an electrical grounding pathway between the rotating component and the stationary component. In some implementations, the grounding device is integrated into a resolver operable to measure an angle of the shaft. In yet other implementations, the grounding device is integrated into an encoder operable to measure a rotational speed of the shaft. In some further implementations, the grounding device is integrated into a carbon seal. In some further implementations, the grounding device is integrated into a brush seal.

Accordingly, during operation of the propulsor at (602), the method (600) can include, in combination, reducing the common mode voltage reaching the electric machine at (602A), interrupting common mode electric current from reaching the shaft to which the electric machine is coupled at (602B), and electrically grounding the shaft to which the electric machine is coupled at (602C). In this way, a three-prong solution to bearing electric current mitigation is achieved. Advantageously, this may enable achieving a specific fuel burn gain through the circulation of electric power between low speed and high speed spools without shortening the life of the spool bearings. Moreover, this may enable mitigating the spool bearing currents without modification of such bearings and with only minimal modification to the spool rotor structure.

Figure 15:
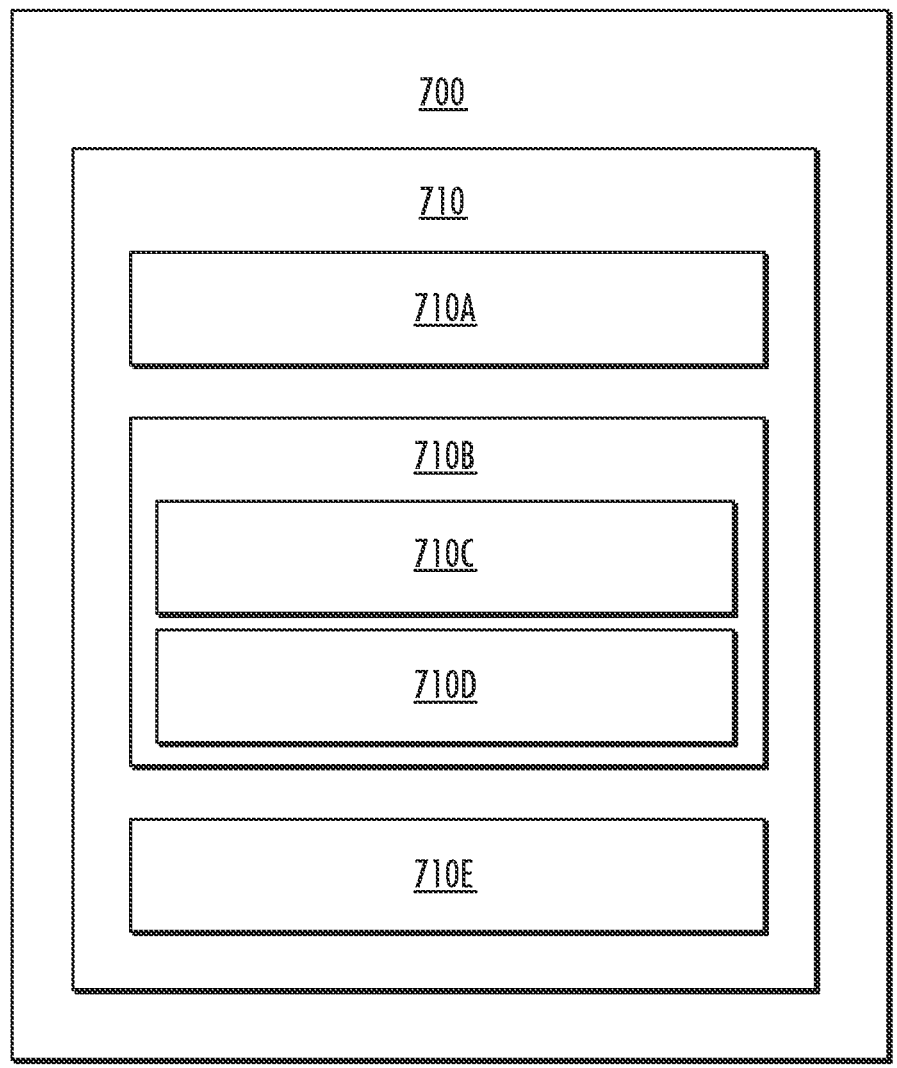
FIG. 15 provides an example computing system according to example embodiments of the present disclosure.

FIG. 15 provides an example computing system 700 according to example embodiments of the present disclosure. The computing systems and devices described herein may include various components and perform various functions of the computing system 700 described below, for example.

As shown in FIG. 15, the computing system 700 can include one or more computing device(s) 710. The computing device(s) 710 can include one or more processor(s) 710A and one or more memory device(s) 710B. The one or more processor(s) 710A can include any suitable processing device, such as a microprocessor, microcontroller, integrated circuit, logic device, and/or other suitable processing device. The one or more memory device(s) 710B can include one or more computer-readable media, including, but not limited to, non-transitory computer-readable media, RAM, ROM, hard drives, flash drives, and/or other memory devices.

The one or more memory device(s) 710B can store information accessible by the one or more processor(s) 710A, including computer-readable instructions 710C that can be executed by the one or more processor(s) 710A. The instructions 710C can be any set of instructions that when executed by the one or more processor(s) 710A, cause the one or more processor(s) 710A to perform operations. In some embodiments, the instructions 710C can be executed by the one or more processor(s) 710A to cause the one or more processor(s) 710A to perform operations, such as any of the operations and functions for which the computing system 700 and/or the computing device(s) 710 are configured. The instructions 710C can be software written in any suitable programming language or can be implemented in hardware. Additionally, and/or alternatively, the instructions 710C can be executed in logically and/or virtually separate threads on processor(s) 710A. The memory device(s) 710B can further store data 710D that can be accessed by the processor(s) 710A. For example, the data 710D can include models, databases, etc.

The computing device(s) 710 can also include a network interface 710E used to communicate, for example, with the other components of system 700 (e.g., via a communication network). The network interface 710E can include any suitable components for interfacing with one or more network(s), including for example, transmitters, receivers, ports, controllers, antennas, and/or other suitable components. One or more devices can be configured to receive one or more commands from the computing device(s) 710 or provide one or more commands to the computing device(s) 710.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

Further aspects of the invention are provided by the subject matter of the following clauses:

1. A hybrid-electric propulsion system, comprising: a power converter; and a propulsor, comprising: a gas turbine engine having a shaft and one or more bearings supporting the shaft; and an electric machine electrically coupled with the power converter and including a stator assembly and a rotor assembly, the rotor assembly having a rotor and a rotor connection assembly, the rotor connection assembly operatively coupling the rotor with the shaft, the rotor connection assembly having an insulated joint for interrupting common mode electric current from flowing between the rotor and the shaft.
2. The hybrid-electric propulsion system of any preceding clause, wherein the rotor connection assembly has a rotor hub and a rotor connection member, the rotor hub being connected to the shaft and the rotor connection member being connected to the rotor, the rotor hub and the rotor connection member being mechanically coupled with one another by the insulated joint.
3. The hybrid-electric propulsion system of any preceding clause, wherein the insulated joint comprises a hub flange of the rotor hub, a connection flange of the rotor connection member, a bolt extending through the hub flange and the connection flange, and one or more insulative members electrically isolating the rotor connection member from the rotor hub.
4. The hybrid-electric propulsion system of any preceding clause, wherein the one or more insulative members include a hub shim positioned between the hub flange and one of a head of the bolt and a nut secured to the bolt opposite the head, an interface shim positioned between the hub flange and the connection flange so that the hub flange and the connection flange are not in physical contact with one another, and a connection flange positioned between the hub flange and one of the head of the bolt and the nut secured to the bolt opposite the head.
5. The hybrid-electric propulsion system of any preceding clause, wherein at least a portion of the bolt is coated with an insulative coating, the portion being in physical contact with at least one of the hub flange and the connection flange.
6. The hybrid-electric propulsion system of any preceding clause, wherein the power converter has an electromagnetic interference filter operable to reduce a common mode voltage reaching the electric machine from the power converter.
7. The hybrid-electric propulsion system of any preceding clause, wherein the power converter is electrically coupled with the electric machine by one or more shielded cables.
8. The hybrid-electric propulsion system of any preceding clause, wherein the gas turbine engine further comprises a grounding device having a stationary component, a rotating component connected to the shaft, and one or more electrical contacts providing an electrical grounding pathway between the rotating component and the stationary component, the stationary component being electrically coupled with a grounding system.
9. The hybrid-electric propulsion system of any preceding clause, wherein the grounding device is integrated into a resolver operable to measure an angle of the shaft or an encoder operable to measure a rotational speed of the shaft.
10. The hybrid-electric propulsion system of any preceding clause, wherein the grounding device is integrated into a carbon seal or a brush seal.
11. The hybrid-electric propulsion system of any preceding clause, wherein the propulsor defines a radial direction, and wherein the rotor is positioned inward of a stator of the stator assembly along the radial direction.
12. The hybrid-electric propulsion system of any preceding clause, wherein the propulsor defines a radial direction, and wherein the rotor is positioned outward of a stator of the stator assembly along the radial direction.
13. The hybrid-electric propulsion system of any preceding clause, wherein the gas turbine engine includes a low speed shaft and a high speed shaft, and wherein the shaft is the low speed shaft.
14. The hybrid-electric propulsion system of any preceding clause, wherein the gas turbine engine includes a low speed shaft and a high speed shaft, and wherein the shaft is the high speed shaft.
15. A method, comprising: operating a propulsor having a gas turbine engine equipped with an electric machine operatively coupled with a shaft of the gas turbine engine, the electric machine being electrically coupled with a power converter, and wherein operating the propulsor comprises: i) reducing, via an electromagnetic interface filter of the power converter, a common mode voltage reaching the electric machine from the power converter; ii) interrupting, via an insulated joint of a rotor connection assembly operatively coupling a rotor of the electric machine with the shaft, a common mode electric current driven by the power converter to the electric machine from flowing between the rotor and the shaft; and iii) electrically grounding, by a grounding device, the shaft.
16. A propulsor, comprising: a gas turbine engine having a shaft; and an electric machine having a stator assembly and a rotor assembly, the rotor assembly having a rotor and a rotor connection assembly, the rotor connection assembly having a rotor connection member connected to the rotor and a rotor hub connected to the shaft, the rotor connection member and the rotor being mechanically coupled with and electrically isolated by an insulated joint; and a grounding device operable to electrically ground the shaft.

17. The propulsor of any preceding clause, wherein the grounding device has a stationary component, a rotating component connected to the shaft, and one or more electrical contacts providing an electrical grounding pathway between the rotating component and the stationary component.

18. The propulsor of any preceding clause, wherein the grounding device is integrated into a resolver operable to measure an angle of the shaft or an encoder operable to measure a rotational speed of the shaft.

19. The propulsor of any preceding clause, wherein the grounding device is integrated into at least one of a carbon seal and a brush seal.

20. The propulsor of any preceding clause, wherein the wherein the rotor connection assembly has a rotor hub and a rotor connection member, the rotor hub being connected to the shaft and the rotor connection member being connected to the rotor, the rotor hub and the rotor connection member being mechanically coupled with one another by the insulated joint, and wherein the insulated joint comprises a hub flange of the rotor hub, a connection flange of the rotor connection member, a bolt extending through the hub flange and the connection flange, and wherein at least one of the hub flange and the connection flange have one or more insulative layers.

What is claimed is:

1. A propulsor, comprising:
    a gas turbine engine having a shaft and one or more bearings supporting the shaft;
    a rotor hub operatively coupled to the shaft and comprising a hub flange;
    an electric machine comprising a stator assembly and a rotor assembly;
    a rotor connection member operatively coupled to the rotor assembly of the electric machine and comprising a connection flange; and
    an insulated joint for operatively coupling the rotor assembly with the shaft, the insulating joint comprising:
        a plurality of insulative layers, at least one of the plurality of insulative layers extending between the hub flange and the connection flange to interrupt common mode electric current from flowing between the rotor assembly and the shaft, wherein the plurality of insulative layers comprise hub-side insulative layers, wherein the hub-side insulative layers comprise an outer layer and an inner layer spaced apart along an axial direction.

2. The propulsor of claim 1, wherein the outer layer forms an outer surface of the hub flange.

3. The propulsor of claim 1, wherein the plurality of insulative layers comprise interface-side insulative layers, wherein the interface-side insulative layers comprise an outer layer and an inner layer spaced apart along an axial direction.

4. The propulsor of claim 3, wherein the outer layer forms an interface between the hub flange and the connection flange.

5. The propulsor of claim 3, wherein the outer layer and the inner layer extend at least partially along the axial direction between an outer member of the hub flange and the connection flange.

6. The propulsor of claim 3, wherein the interface-side insulative layers form part of the hub flange or the connection flange.

7. The propulsor of claim 1, wherein the plurality of insulative layers comprise aperture-side insulative layers, wherein the aperture-side insulative layers comprise an outer layer and an inner layer spaced apart along a radial direction.

8. The propulsor of claim 7, wherein the outer layer extends circumferentially around an aperture defined by at least one of the hub flange or the connection flange.

9. The propulsor of claim 1, a bolt extending through the hub flange and the connection flange, wherein at least one of the plurality of insulative layers extends between the bolt and the hub flange and at least one of the plurality of insulative layers extends between the bolt and the connection flange.

10. The propulsor of claim 9, wherein at least a portion of the bolt is coated with an insulative coating, the portion being in physical contact with at least one of the hub flange or the connection flange.

11. The propulsor of claim 9, wherein the insulated joint further comprises:
    a hub shim positioned between the hub flange and one of a head of the bolt and a nut secured to the bolt opposite the head, an interface shim positioned between the hub flange and the connection flange so that the hub flange and the connection flange are not in physical contact with one another, and a connection shim positioned between the hub flange and one of the head of the bolt and the nut secured to the bolt opposite the head.

12. The propulsor of claim 1, wherein at least one of the plurality of insulative layers comprises at least two layers and wherein a metallic layer is positioned at least partially between the at least two layers.

13. The propulsor of claim 1, wherein the plurality of insulative layers are formed from ceramic.

14. The propulsor of claim 1, wherein the electric machine is electrically coupled with a power converter.

15. The propulsor of claim 1, wherein the gas turbine engine further comprises a grounding device having a stationary component, a rotating component connected to the shaft, and one or more electrical contacts providing an electrical grounding pathway between the rotating component and the stationary component, the stationary component being electrically coupled with a grounding system.

16. The propulsor of claim 15, wherein the grounding device is integrated into a brush seal, the brush seal comprising a plurality of brushes separated by walls that extend along a radial direction.

17. The propulsor of claim 16, wherein the shaft comprises a wear resistant coating and a distal end of each of the plurality of brushes contact the wear resistant coating.

18. The propulsor of claim 1, wherein the gas turbine engine includes a low speed shaft and a high speed shaft, and wherein the shaft is the low speed shaft.

19. A method, comprising:
    operating a propulsor having a gas turbine engine equipped with an electric machine operatively coupled with a shaft of the gas turbine engine, the electric machine being electrically coupled with a power converter, and a rotor hub comprising a hub flange and being operatively coupled to the shaft; and
    wherein operating the propulsor comprises:
    i) interrupting, via an insulated joint that operatively couples a rotor assembly of the electric machine with the shaft, a common mode electric current driven by the power converter to the electric machine from flowing between the rotor assembly and the shaft, the insulated joint comprising a plurality of insulative layers, at least one of the plurality of insulative layers extending between the hub flange and a connection flange of the rotor assembly, wherein the plurality of insulative layers comprise hub-side insulative layers, wherein the hub-side insulative layers comprise an outer layer and an inner layer spaced apart along an axial direction; and ii) electrically grounding, by a grounding device, the shaft.

20. A propulsor, comprising:

a gas turbine engine having a shaft and one or more bearings supporting the shaft;

a rotor hub operatively coupled to the shaft and comprising a hub flange;

an electric machine comprising a stator assembly and a rotor assembly;

a rotor connection member operatively coupled to the rotor assembly of the electric machine and comprising a connection flange; and an insulated joint for operatively coupling the rotor assembly with the shaft, the insulating joint comprising:

a plurality of insulative layers, at least one of the plurality of insulative layers extending between the hub flange and the connection flange to interrupt common mode electric current from flowing between the rotor assembly and the shaft, wherein the plurality of insulative layers comprise interface-side insulative layers, wherein the interface-side insulative layers comprise an outer layer and an inner layer spaced apart along an axial direction.

* * * * *